United States Patent
Oikawa

(10) Patent No.: US 9,532,455 B2
(45) Date of Patent: Dec. 27, 2016

(54) SEMICONDUCTOR DEVICE AND CIRCUIT BOARD

(71) Applicant: Renesas Electronics Corporation, Kawasaki-shi (JP)

(72) Inventor: Ryuichi Oikawa, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 513 days.

(21) Appl. No.: 14/050,258

(22) Filed: Oct. 9, 2013

(65) Prior Publication Data

US 2014/0104802 A1    Apr. 17, 2014

(30) Foreign Application Priority Data

Oct. 16, 2012 (JP) .................................. 2012-228830

(51) Int. Cl.
*H01L 23/64* (2006.01)
*H05K 1/18* (2006.01)
(Continued)

(52) U.S. Cl.
CPC ........... *H05K 1/18* (2013.01); *H01L 23/49822* (2013.01); *H01L 23/49827* (2013.01);
(Continued)

(58) Field of Classification Search
CPC ................................................ H01L 23/49534
See application file for complete search history.

(56) References Cited

U.S. PATENT DOCUMENTS

| 5,675,299 A | 10/1997 | Suski |
| 2004/0056344 A1 | 3/2004 | Ogawa et al. |
| 2006/0044735 A1* | 3/2006 | Hayashi ............ H01L 23/49816 361/313 |

FOREIGN PATENT DOCUMENTS

| JP | 2000-507427 A | 6/2000 |
| JP | 2003-158239 A | 5/2003 |
| (Continued) | | |

OTHER PUBLICATIONS

Nanju Na, et al. "Package Performance Improvement with Counter-Discontinuity and its Effective Bandwidth", Proceedings of 16th Topical meeting on Electrical Performance of Electronic Packaging, p. 163 to p. 168 (2007).

(Continued)

*Primary Examiner* — Mark Tornow
(74) *Attorney, Agent, or Firm* — McGinn IP Law Group, PLLC.

(57) ABSTRACT

A semiconductor device includes a semiconductor chip, a plurality of external terminals, and a board. The board includes a first main surface in which a plurality of first electrodes electrically connected to the semiconductor chip are formed, a second main surface in which a plurality of second electrodes electrically connected to the plurality of external terminals are formed, and a plurality of interconnect layers, provided between the first main surface and the second main surface, for forming a plurality of signal paths that electrically connect the first electrode and the second electrode corresponding thereto. The interconnect layer includes a plurality of metal members which are dispersedly disposed at a distance shorter than an electromagnetic wavelength equivalent to a signal band of a signal supplied to the signal path, in the vicinity of a portion in which a structure of an interconnect for forming the signal path is changed.

20 Claims, 26 Drawing Sheets

(51) Int. Cl.
  *H05K 1/02*      (2006.01)
  *H01L 23/498*    (2006.01)
  *H01L 23/66*         (2006.01)
  *H05K 3/42*          (2006.01)
  *H05K 3/46*          (2006.01)
  *H01L 21/48*         (2006.01)

(52) U.S. Cl.
  CPC ......... *H01L 23/64* (2013.01); *H05K 1/0219* (2013.01); *H05K 1/0225* (2013.01); *H05K 1/0236* (2013.01); *H05K 1/0248* (2013.01); *H05K 1/0251* (2013.01); *H01L 21/486* (2013.01); *H01L 21/4857* (2013.01); *H01L 23/49811* (2013.01); *H01L 23/66* (2013.01); *H01L 2223/6616* (2013.01); *H01L 2223/6638* (2013.01); *H01L 2224/16225* (2013.01); *H01L 2224/49171* (2013.01); *H01L 2924/00* (2013.01); *H01L 2924/13091* (2013.01); *H01L 2924/15311* (2013.01); *H01L 2924/30111* (2013.01); *H05K 1/0245* (2013.01); *H05K 3/429* (2013.01); *H05K 3/4602* (2013.01); *H05K 2201/096* (2013.01); *H05K 2201/09227* (2013.01); *H05K 2201/09281* (2013.01); *H05K 2201/09627* (2013.01); *H05K 2201/10734* (2013.01)

(56) References Cited

FOREIGN PATENT DOCUMENTS

| | | |
|---|---|---|
| JP | 2004-253947 A | 9/2004 |
| JP | 2009-212400 A | 9/2009 |

OTHER PUBLICATIONS

Namhoon Kim, et al. "Spiral Via Structure in a BGA Package to Mitigate Discontinuities in Multi-Gigabit SERDES System", Proceedings of 60th Electronic Components and Technology Conference, p. 1474 to p. 1478 (2010).

Japanese Office Action, Jun. 30, 2016, with an English translation.

* cited by examiner

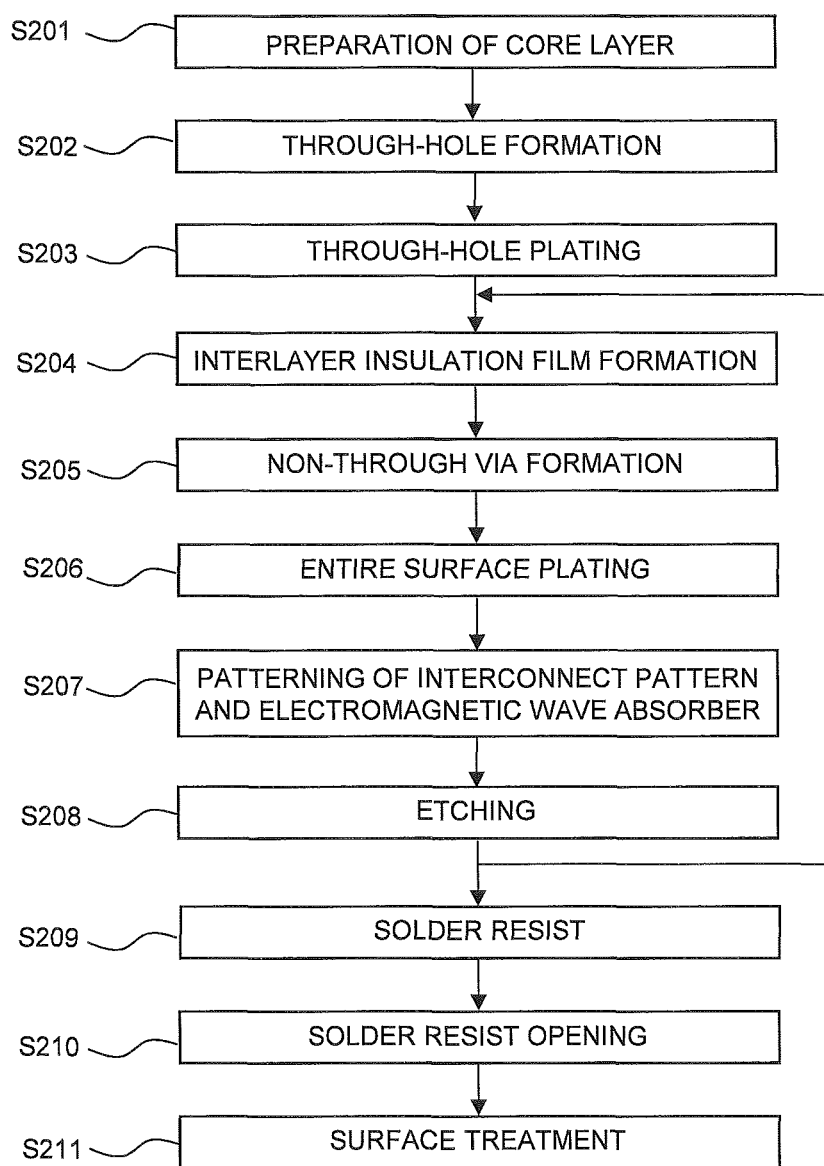

| FREQUENCY(GHz) | DISTANCE X BETWEEN METAL PIECES (MESH DISTANCE) (λ/20) |
|---|---|
| 1GHz | 8.0mm OR LESS |
| 10GHz | 800μm OR LESS |
| 20GHz | 400μm OR LESS |
| 40GHz | 200μm OR LESS |
| 80GHz | 100μm OR LESS |
| 100GHz | 80μm OR LESS |

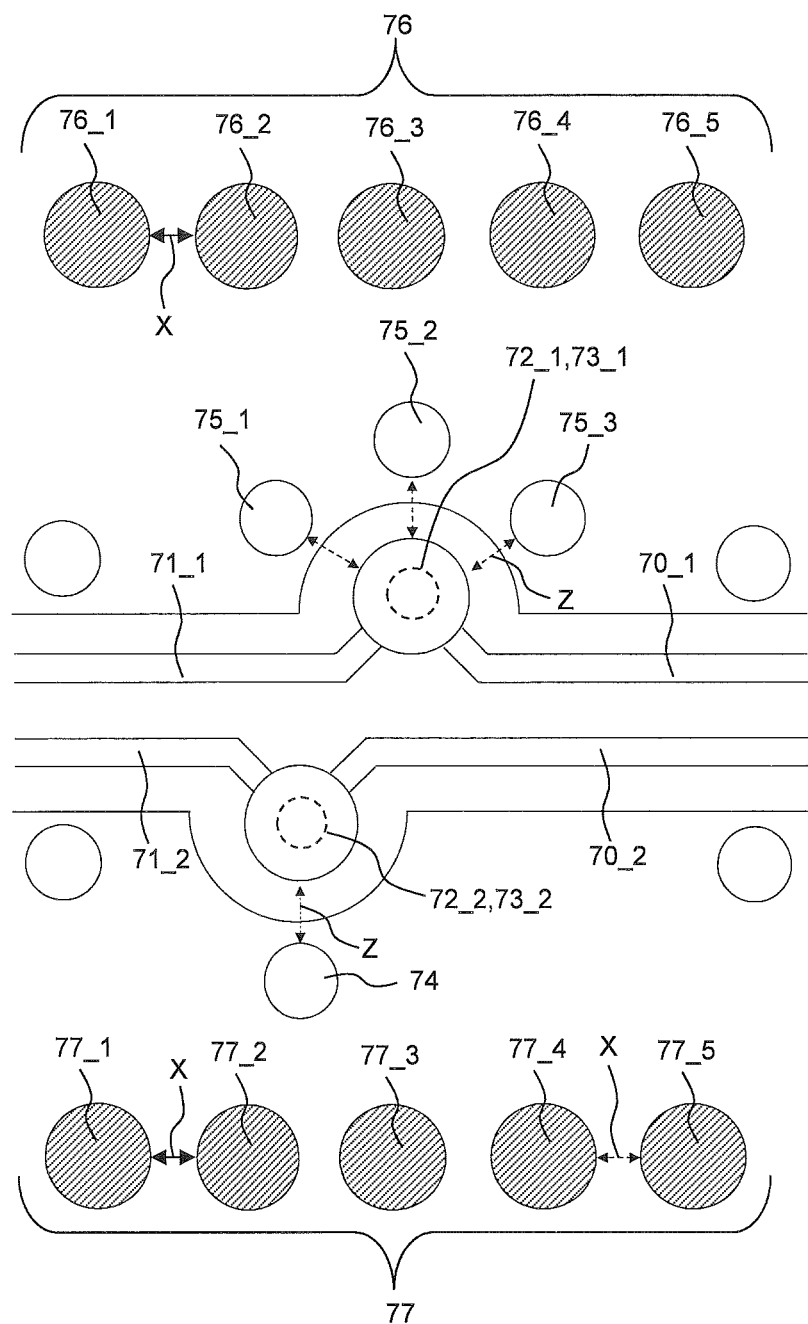

SEMICONDUCTOR DEVICE AND CIRCUIT BOARD

CROSS-REFERENCE TO RELATED APPLICATIONS

The Present application claims priority from Japanese application JP 2012-228830 filed on Oct. 16, 2012, the content of which is hereby incorporated by reference into this application.

BACKGROUND

The present invention relates to a semiconductor device and a circuit board, and particularly, relates to a technique effective when applied to a semiconductor device having a BGA (Ball Grid Array) structure.

In a plurality of semiconductor devices which are mounted on a circuit board such as a printed board, various discontinuities are present in a signal transmission path for transmitting a signal which is output from one semiconductor device to another semiconductor device, and thus the challenge is how to nullify the discontinuities. In recent years, particularly, in order to nullify impedance discontinuity, a technique for canceling impedance discontinuity using reverse impedance discontinuity has been widely adopted. In short, this technique is configured such that, for example, in case that capacitive (<50 ohm) impedance discontinuity is present in a signal transmission path, inductive (>50 ohm) impedance discontinuity is disposed next to a portion in which capacitive impedance discontinuity is present within the signal transmission path along a signal transmission direction, to reduce signal reflection by bringing average impedance close to 50 Ohm.

The related art of techniques for nullifying the above-mentioned impedance discontinuity is disclosed in JP-A-2004-253947; Nanju Na, Mark Bailey and Asad Kalantarian, "Package Performance Improvement with Counter-Discontinuity and its Effective Bandwidth", Proceedings of 16th Topical meeting on Electrical Performance of Electronic Packaging, p. 163 to p. 168 (2007); and Namhoon Kim, Hongsik Ahn, Chris Wyland, Ray Anderson, Paul Wu, "Spiral Via Structure in a BGA Package to Mitigate Discontinuities in Multi-Gigabit SERDES System", Proceedings of 60th Electronic Components and Technology Conference, p. 1474 to p. 1478 (2010).

JP-A-2004-253947 discloses a technique for serially connecting a third planar line having characteristic impedance higher than that of a first planar line to a fourth planar line having characteristic impedance higher than that of a second planar line, between the first planar line and the second planar line having characteristic impedance higher than that of the first planar line.

Nanju Na, Mark Bailey and Asad Kalantarian, "Package Performance Improvement with Counter-Discontinuity and its Effective Bandwidth", Proceedings of 16th Topical meeting on Electrical Performance of Electronic Packaging, p. 163 to p. 168 (2007) discloses a technique for adjusting average impedance to 50 ohm by interposing the front and rear of a low impedance portion constituted by a through via and a solder ball pad in a high impedance line, as shown in FIG. 6 of the above document.

Namhoon Kim, Hongsik Ahn, Chris Wyland, Ray Anderson, Paul Wu, "Spiral Via Structure in a BGA Package to Mitigate Discontinuities in Multi-Gigabit SERDES System", Proceedings of 60th Electronic Components and Technology Conference, p. 1474 to p. 1478 (2010) discloses a technique for adjusting average impedance of a signal transmission path including a low impedance portion constituted by a through via and a solder ball pad to 50 ohm, using a conductive layer having a shape of an inductor created by combining a small via and an interconnect pattern.

SUMMARY

However, as in the related art, in a method of further adding reverse impedance discontinuity into a transmission path in order to cancel impedance discontinuity, two impedance discontinuities are viewed due to a signal (signal of, for example, 10 GHz or more) having a relatively high frequency. That is, a signal is reflected in the boundary of impedance discontinuity having approximately twice the impedance discontinuity. For example, as shown in a right characteristic diagram of FIG. 6 in Nanju Na, Mark Bailey and Asad Kalantarian, "Package Performance Improvement with Counter-Discontinuity and its Effective Bandwidth", Proceedings of 16th Topical meeting on Electrical Performance of Electronic Packaging, p. 163 to p. 168 (2007), characteristics in any case show transmission characteristics better than a reference in a range having a low frequency, but become rather worse than a reference in case that the frequency is higher. FIG. 7 of the above document shows a characteristic diagram in case that the impedance of the low impedance portion constituted by the through via and the solder ball pad is brought close to 50 ohm, in addition to a configuration in which a high impedance line is interposed. According to this characteristic diagram, eventually, it is difficult to cancel impedance discontinuity in a wide band by adding reverse impedance discontinuity, and thus it is understood that a measure has to be taken to bring the impedance of the pre-existent low impedance portion itself close to 50 ohm.

As mentioned above, according to the related art, a signal having a relatively low frequency does not cause a problem, but a signal having a sufficiently high frequency deteriorates signal transmission performance further than in a case where no measure is taken. Consequently, the present inventor has considered that a new technique for realizing a broadband signal transmission path is required.

Means and the like for solving such a problem will be described below, but other problems and novel features will be apparent from the following description and accompanying drawings of the specification.

A typical one of embodiments disclosed in the present application is summarized as follows.

That is, a semiconductor device includes a semiconductor chip, a plurality of external terminals, and a board for electrically connecting the semiconductor chip and the external terminal. The board includes a first main surface in which a plurality of first electrodes electrically connected to the semiconductor chip are formed, a second main surface in which a plurality of second electrodes electrically connected to the plurality of external terminals are formed, and a plurality of interconnect layers, provided between the first main surface and the second main surface, for forming a plurality of signal paths that electrically connect the first electrode and the second electrode corresponding thereto. The interconnect layer includes a plurality of metal members which are dispersedly disposed at a distance shorter than an electromagnetic wavelength equivalent to a signal band of a signal supplied to the signal path, in the vicinity of a portion in which a structure of an interconnect for forming the signal path is changed.

An effect obtained by the typical one of embodiments disclosed in the present application will be summarized as follows.

That is, according to the semiconductor device, it is possible to realize good signal transmission characteristics over a broad band.

BRIEF DESCRIPTION OF THE DRAWINGS

FIG. 8 is a flow diagram illustrating an outline of a process of manufacturing a circuit board.

FIG. 25 is a diagram illustrating the electromagnetic wave absorber disposed in the vicinity of the interconnect portion of the differential signal path.

DETAILED DESCRIPTION

1. Summary of the Embodiments

Figure 1:
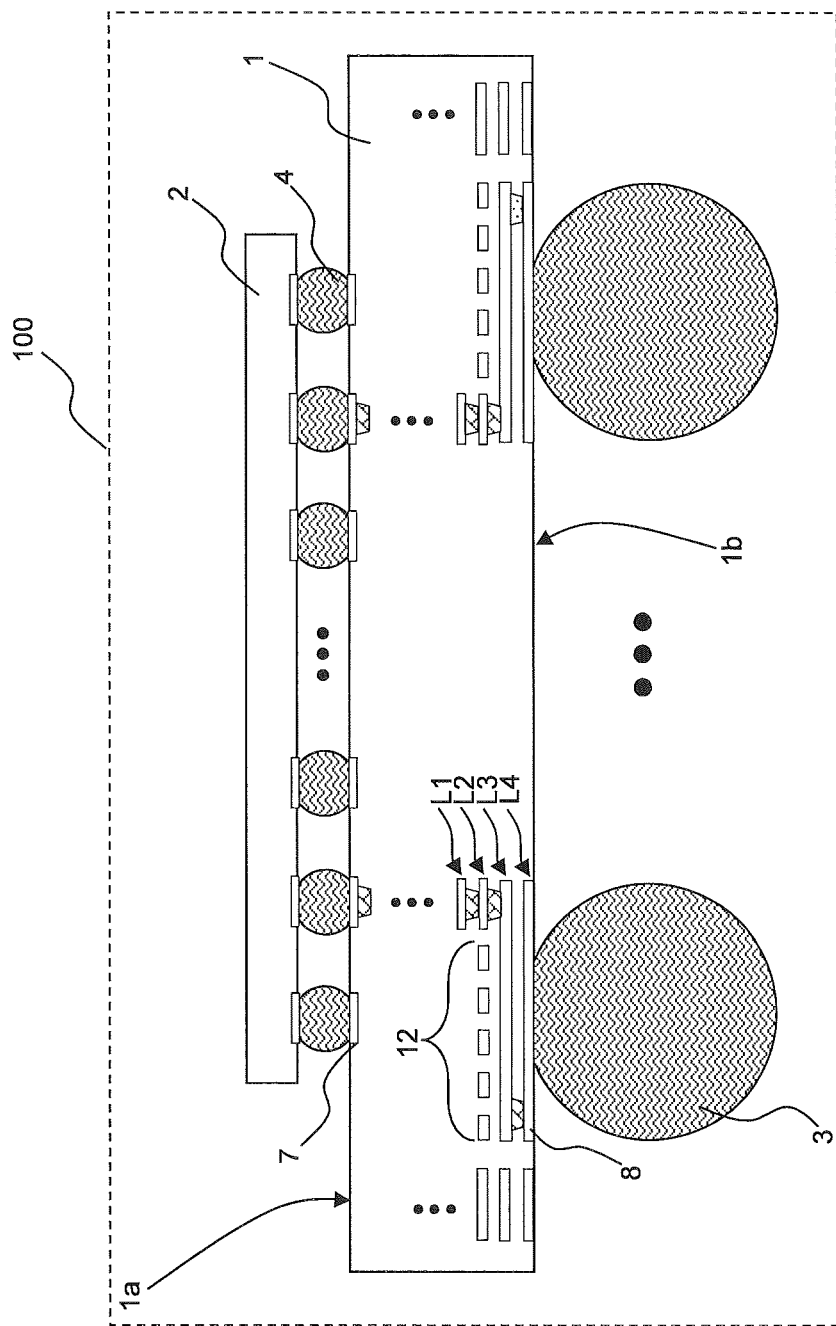
FIG. 1 is a cross-sectional view illustrating an example of a semiconductor device according to a typical embodiment of the present application.

First, the summary of typical embodiments disclosed in the present application will be described. Reference numerals and signs in the drawings that are referred to with parentheses applied thereto in the description of the summary of the typical embodiments are merely illustrative of what are included in the concepts of components marked with the reference numerals and signs.

[1] (Semiconductor Device Configured to Include Circuit Board having a Plurality of Metal Pieces Separately Disposed)

As shown in FIG. 1, a semiconductor device (100) according to a typical embodiment of the present application includes a semiconductor chip (2), a plurality of external terminals (3), and a board (1) for electrically connecting the semiconductor chip and the external terminals. The board includes a first main surface (1a) in which a plurality of first electrodes (7) electrically connected to the semiconductor chip are formed, and a second main surface (1b), facing the first main surface, in which a plurality of second electrodes (8) electrically connected to the plurality of external terminals are formed. The board further includes a plurality of interconnect layers (LW1 to LWn (L1 to L4)), provided between the first main surface and the second main surface, for forming a plurality of signal paths that electrically connect the first electrode and the second electrode corresponding thereto. The interconnect layer includes a plurality of metal members (12) which are dispersedly disposed at a distance shorter than an electromagnetic wavelength equivalent to a signal band of a signal supplied to the signal path, in the vicinity of a portion in which a structure of an interconnect for forming the signal path is changed.

Electromagnetic waves traveling through the signal path are scattered in the portion in which the interconnect structure of the signal path is changed. Some of the scattered electromagnetic waves return to an original direction, and thus the portion in which the interconnect structure of the signal path is changed is observed as a portion having impedance discontinuity. According to the semiconductor device, the scattered electromagnetic waves cannot pass through a small gap between the plurality of metal members, are absorbed by the metal member, and are converted into Joule heat by the surface resistance of the metal members. Thereby, the amount of the scattered electromagnetic waves returning to an original direction decreases, and the scattered electromagnetic waves are observed so that impedance is matched in an electric circuit manner. In addition, since the electromagnetic waves are absorbed by a metal, both an electric field and a magnetic field can be converted into Joule heat That is, according to the semiconductor device, it is possible to eliminate impedance discontinuity regardless of the sign (capacitive or inductive) of impedance discontinuity, and to realize good signal transmission characteristics over a broad band without deteriorating signal transmission performance at a high frequency.

[2] (Metal Piece: Distance Equal to or Less Than 1/20 of Wavelength)

The semiconductor device (100) as described above in 1, wherein the plurality of metal members are dispersedly formed at a distance equal to or less than one twentieth of an electromagnetic wavelength ($\lambda$) equivalent to a signal band of a signal supplied to the signal path.

According to this, it is possible to more efficiently absorb the scattered electromagnetic waves.

[3] (Metal Piece: Formation on the Upper Portion of Solder Ball Pad)

The semiconductor device as described above in 1 or 2, wherein the plurality of metal members are formed in at least one interconnect layer of the plurality of interconnect layers so as to overlap the second electrode when seen in a plan view.

According to this, since the scattered electromagnetic waves generated at the joint between the second electrode to which the external terminal is connected and the interconnect formed on the interconnect layer can be efficiently removed, it is possible to greatly alleviate a deterioration in signal transmission performance.

[4] (Metal Piece: Insertion of Interconnect Having Inductive Impedance)

The semiconductor device as described above in 3, wherein a signal line (23) having inductive impedance is formed in an interconnect layer (L3) different from an interconnect layer (L2) in which the plurality of metal members are formed. In addition, the second electrode is connected to the first electrode through the signal line having inductive impedance.

According to this, in the signal path between the first electrode and the second electrode, an inductive impedance component is inserted into a capacitive impedance component based on the second electrode to which the external terminal is connected, and thus it is possible to further improve transmission performance for a signal of a low frequency.

Figure 17A:
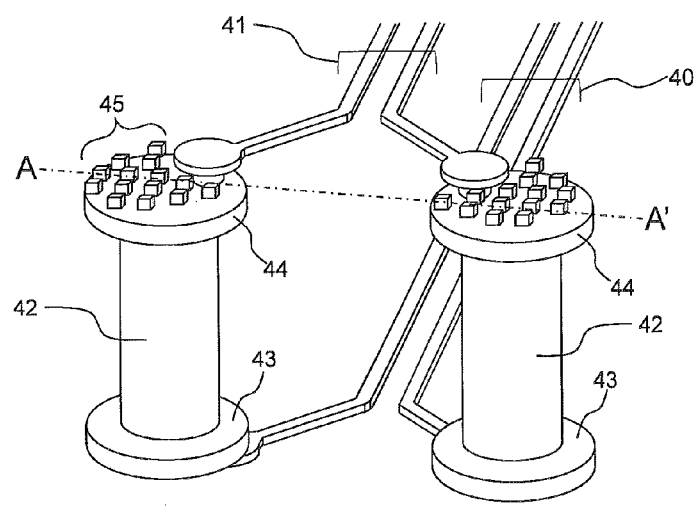
FIGS. 17A to 17C are diagrams illustrating the electromagnetic wave absorber provided in the vicinity of a through hole.
Figure 17B:
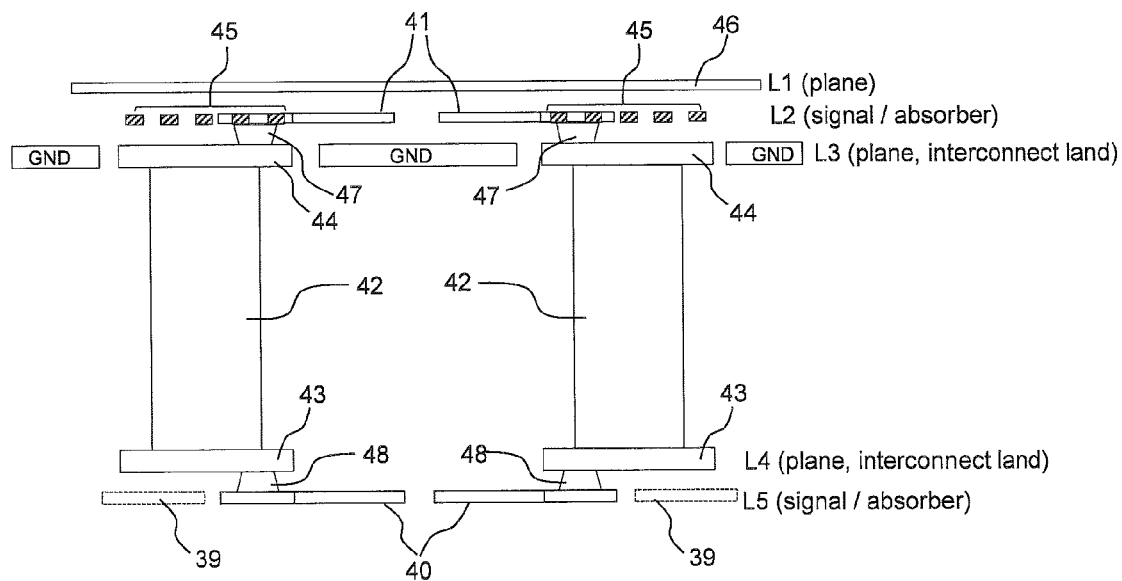
Figure 17C:
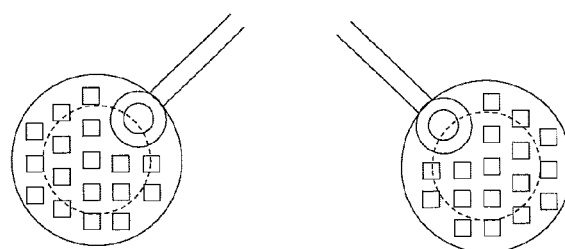

[5] (Metal Piece: Disposition immediately above Through Via: FIGS. 17A to 17C)

The semiconductor device as described above in nay one of 1 to 4, wherein the board further includes a through via (42) which is formed passing through a plurality of interconnect layers, and a first non-through via (48) and a second non-through via (47) for connecting interconnect layers adjacent to each other. The plurality of interconnect layers include a first interconnect layer (L5) in which a first signal line (40) is formed, and a second interconnect layer (L4), provided at an upper side of the first interconnect layer when seen in a cross-sectional view, in which a first interconnect land (43) is formed. Further, the plurality of interconnect layers include a third interconnect layer (L3), provided at an upper side of the second interconnect layer when seen in a cross-sectional view, in which a second interconnect land (44) is formed, and a fourth interconnect layer (L2), provided at an upper side of the third interconnect layer when seen in a cross-sectional view, in which a second interconnect (41) is formed. The first interconnect land and the second interconnect land are connected to each other through the through via. The first interconnect land and the first interconnect are connected to each other through the first non-through via, and the second interconnect land and the second interconnect are connected to each other through the second non-through via. The plurality of metal members are formed in the fourth interconnect layer so as to overlap the through via when seen in a plan view.

According to this, since the scattered electromagnetic waves generated at the joint between the interconnect land located at the upper side of the through via and the second interconnect can be efficiently removed, it is possible to greatly alleviate a deterioration in signal transmission performance.

[6] (Metal Piece: Disposition immediately below Through Via)

The semiconductor device as described above in 5, wherein the plurality of metal members are formed in the first interconnect layer (L5 (39)) so as to overlap the through via when seen in a plan view.

According to this, since the scattered electromagnetic waves generated at the joint between the interconnect land located at the lower side of the through via and the first interconnect can be efficiently removed, it is possible to further alleviate a deterioration in signal transmission performance.

[7] (Metal Piece: Disposition in Asymmetric Portion of Two Signal Lines Constituting Differential Pair)

The semiconductor device as described above in any one of 1 to 6, wherein the plurality of signal paths include two signal paths (52, 61, 65) constituting a differential pair. The plurality of metal members (53_1 to 53_4, and 63) are formed in the vicinity of an asymmetric portion in the two signal paths.

Traveling electromagnetic waves propagating through the signal path constituting a differential pair are generated by the synthesis of an electromagnetic field in a bonding mode which is localized between two differential signal paths and an electromagnetic field in a non-bonding mode which spreads around the two differential signal paths. In case that signal electromagnetic waves reach the asymmetric portion in the signal path, an electromagnetic field in an anti-bonding mode is excited. Thereby, common mode noise is generated. The excitation of the electromagnetic field in an anti-bonding mode is observed, in an electric circuit manner, as the impedance asymmetry of the differential pair, or the difference (hereinafter, referred to as a skew) between two signals of the propagation delay time of a signal transmitted through the differential transmission path. According to the semiconductor device, since the electromagnetic field in a non-bonding mode can be removed by the plurality of metal members disposed in the vicinity of the asymmetric portion in the differential signal path, it is possible to suppress the generation of the common mode noise.

[8] (Metal Piece: Disposition so as to Interpose Asymmetric Portion of Differential Pair)

The semiconductor device as described above in 7, wherein the plurality of interconnect layers include an interconnect layer in which a third signal line (52_1) and a fourth signal line (52_2) for constituting a differential pair with the third signal line are formed. In the interconnect layer in which the third signal line and the fourth signal line are formed, the plurality of metal members (53_1 to 53_4) are disposed so as to interpose a portion (51) in which the third signal line and the fourth signal line are asymmetric.

According to this, it is possible to effectively remove the electromagnetic field in a non-bonding mode.

[9] (Metal Piece: Disposition in Portion Having Different Interconnect Pattern)

The semiconductor device as described above in 8, the portion in which the third signal line and the fourth signal line are asymmetric is a portion in which a shape of an interconnect pattern of the third signal line and a shape of an interconnect pattern of the fourth signal line are different from each other.

[10] (Metal Piece: Disposition in Portion Having Different Structure of Upper And Lower Interconnect Layers)

The semiconductor device as described above in 8, wherein the portion in which the third signal line and the fourth signal line are asymmetric is a portion (51) in which a structure of an interconnect layer located at an upper or lower side of the third signal line and a structure of an interconnect layer located at an upper or lower side of the fourth signal line are different from each other.

[11] (Metal Piece: Shielding Pattern between Different Differential Pairs)

The semiconductor device as described above in 7, wherein the plurality of interconnect layers include an interconnect layer in which a first differential signal line pair (61 or 65) constituted by two signal lines, a second differential signal line pair (60) constituted by two signal lines which is different from the first differential signal line pair, and a shielding pattern (63) disposed in parallel between the first differential signal line pair and the second differential signal line pair are formed. In the shielding pattern, a portion of an interconnect pattern between an asymmetric portion in the first differential signal line pair and the second differential signal line pair is formed in a perforation shape.

According to this, since the electromagnetic field in a non-bonding mode generated due to the asymmetric portion in the first differential signal line pair can be removed by a perforation-shaped shielding pattern, it is possible to reduce crosstalk on the second differential signal line pair.

[12] (Via/Metal Piece: Interconnect Portion of Differential Signal)

The semiconductor device as described above in 7, wherein the board further includes a first signal via (72_1 or 73_1) and a second signal via (72_2 or 73_2) for electrically connecting a signal line formed in a different interconnect layer, and a first ground via (75_1 to 75_3) and a second ground via (74), connected to a ground interconnect formed in a different interconnect layer, which are provided corresponding to the first signal via and the second signal via. The plurality of interconnect layers include a fifth interconnect layer in which a third signal line (70_1) and a fourth signal line (70_2) for constituting a differential pair with the third signal line are formed, and a sixth interconnect layer in which a fifth signal line (71_1) and a sixth signal line (71_2) for constituting a differential pair with the fifth signal line are formed. The third signal line and the fifth signal line are electrically connected to each other through the first signal via, and the fourth signal line and the sixth signal line are electrically connected to each other through the second signal via. The first ground via is disposed at a predetermined distance (Z) from the first via, and the second ground via is disposed at the predetermined distance (Z) from the second via. The number of first ground vias and the number of second ground vias are different from each other. The plurality of metal members (76, 77, or 78) are disposed in the vicinity of a region including the first signal via, the second signal via, the first ground via, and the second ground via.

According to this, the number of first ground vias disposed in the vicinity of the first signal via and the number of second ground vias disposed in the vicinity of the second signal via are different from each other, and thus it is possible to remove the electromagnetic field in a non-bonding mode generated in the vicinity of the first signal via and the second signal via by the plurality of metal members, and to suppress the generation of the common mode noise.

[13] (Metal Piece: Disposition in Interconnect Portion in Ring Shape)

The semiconductor device as described above in 12, wherein the plurality of metal members (78) are disposed outside the region in a ring shape when seen in a plan view.

According to this, it is possible to reduce a skew in a low frequency region.

[14] (Via: Linear side-by-side Disposition in Interconnect Portion)

The semiconductor device as described above in 12 or 13, wherein the plurality of metal members are linearly disposed outside the region when seen in a plan view. In addition, the metal member is configured to include a via (76 or 77) for connecting different interconnect layers.

According to this, it is possible to reduce amplitude imbalance between two signals constituting a differential signal.

[15] (Shape of Metal Piece: Circular)

The semiconductor device as described above in any one of 1 to 14, wherein the metal member is formed in a circular shape when seen in a plan view.

[16] (Semiconductor Device Including Circuit Board on Which Metal Pattern having a Plurality of Through Holes is Formed)

A semiconductor device (100) according to another typical embodiment of the present application includes a semiconductor chip (2), a plurality of external terminals (3), and a board (1) for electrically connecting the semiconductor chip and the external terminal. The board includes a first main surface (1a) in which a plurality of first electrodes (7) electrically connected to the semiconductor chip are formed, and a second main surface (1b), facing the first main surface, in which a plurality of second electrodes (8) electrically connected to the plurality of external terminals are formed. The board further includes a plurality of interconnect layers (LW1 to LWn (L1 to L4)), provided between the first main surface and the second main surface, for forming a plurality of signal paths that electrically connect the first electrode and the second electrode corresponding thereto. The interconnect layer includes a metal pattern (26) in which a plurality of through holes (27) are dispersedly formed, in the vicinity of a portion in which a structure of an interconnect for forming the signal path is changed.

According to this, as is the case with [1], it is possible to eliminate impedance discontinuity regardless of the sign of impedance discontinuity, and to realize good signal transmission characteristics over a broad band without deteriorating signal transmission performance at a high frequency.

[17] (Metal Pattern: Distance Equal to or Less Than 1/20 of Wavelength)

The semiconductor device as described above in 16, wherein the plurality of through holes in the metal pattern are formed so that a diameter (X) thereof is equal to or less than one twentieth of an electromagnetic wavelength (λ) equivalent to a signal band of a signal supplied to the signal path.

According to this, it is possible to more efficiently absorb the scattered electromagnetic waves.

[18] (Metal Pattern: Formation in Interconnect Layer Located on Upper Portion of Solder Ball Pad)

The semiconductor device as described above in 16 or 17, wherein the metal pattern is formed in at least one interconnect layer of the plurality of interconnect layers so as to overlap the second electrode when seen in a plan view.

According to this, as is the case with [3], it is possible to greatly alleviate a deterioration in signal transmission performance.

[19] (Metal Pattern: Further Inclusion of Inductive Interconnect)

The semiconductor device as described above in 18, wherein a signal line (23) having inductive impedance is formed in an interconnect layer (L3) different from an interconnect layer (L2) in which the metal pattern is formed. In addition, the second electrode is connected to the first electrode through the signal line having inductive impedance.

According to this, as is the case with [4], it is possible to further improve transmission performance for a signal of a low frequency.

[20] (Circuit Board in Which Metal Pattern Having a Plurality of Through Holes is Formed)

A circuit board (1) according to a typical embodiment of the present application includes a first main surface (1a) in which a plurality of first electrodes (7) are formed, a second main surface (1b), facing the first main surface, in which a plurality of second electrodes (8) are formed, and a plurality of interconnect layers (LW1 to LWn (L1 to L4)), provided between the first main surface and the second main surface, for forming a plurality of signal paths that electrically connect the first electrode and the second electrode corresponding thereto. The interconnect layer includes a metal pattern (26) in which a plurality of through holes (27) are dispersedly formed, in the vicinity of a portion in which a structure of an interconnect for forming the signal path is changed.

According to this, it is possible to eliminate impedance discontinuity in the interconnect formed in the circuit board regardless of the sign of impedance discontinuity, and to realize good signal transmission characteristics over a broad band without deteriorating signal transmission performance at a high frequency.

[21] (Circuit Board: Distance Equal to or Less Than 1/20 of Wavelength)

The circuit board as described above in 20, wherein the plurality of through holes in the metal pattern is formed so that a diameter (X) thereof is equal to or less than one twentieth of an electromagnetic wavelength (λ) equivalent to a signal band of a signal to be supplied.

According to this, it is possible to more efficiently absorb the scattered electromagnetic waves.

[22] (Circuit Board: Formation in Interconnect Layer Located on Upper Portion of Solder Ball Pad)

The circuit board as described above in 20 or 21, wherein the metal pattern is formed in at least one interconnect layer of the plurality of interconnect layers so as to overlap the second electrode when seen in a plan view.

According to this, since the scattered electromagnetic waves generated at the joint between the second electrode to which the external terminal is connected and the interconnect formed on the interconnect layer can be efficiently removed, it is possible to greatly alleviate a deterioration in signal transmission performance in the circuit board.

[23] (Circuit Board: Further Inclusion in Inductive Interconnect)

The circuit board as described above in 22, wherein the signal path is formed including a signal line (23) having inductive impedance.

According to this, an inductive impedance component is inserted into a capacitive impedance component based on the second electrode to which the external terminal is connected, and thus it is possible to further improve transmission performance for a signal of a low frequency in the circuit board.

Figure 18A:
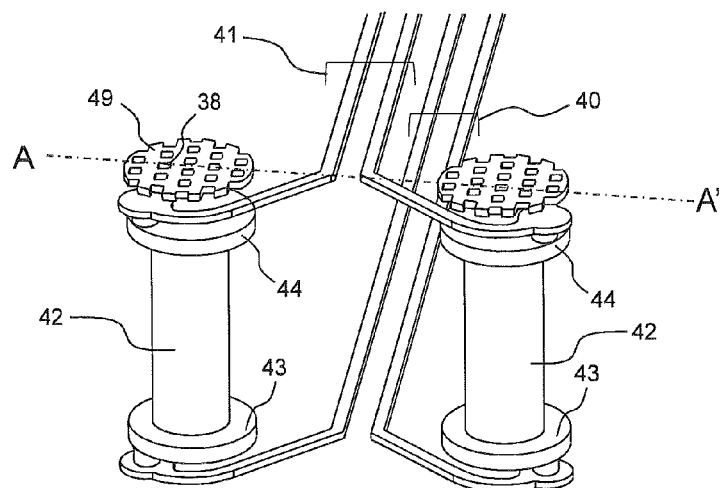
FIGS. 18A to 18C are diagrams illustrating another electromagnetic wave absorber provided in the vicinity of the through hole.
Figure 18B:
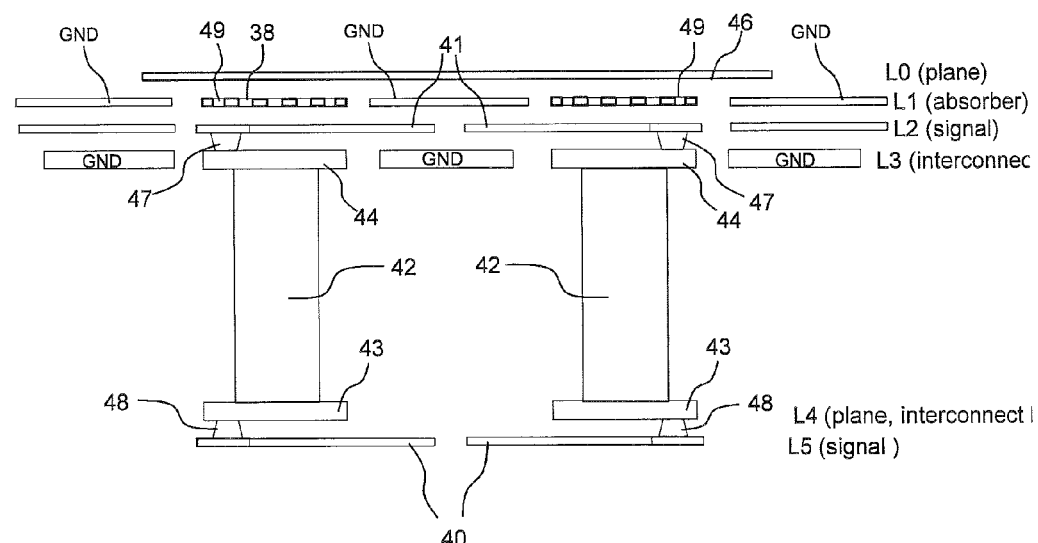
Figure 18C:
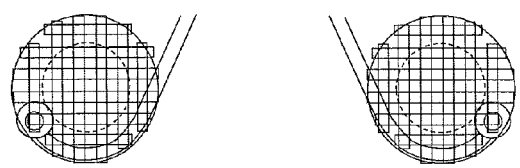

[24] (Circuit Board: Disposition Immediately Above Through Via: FIGS. 18A to 18C)

The circuit board as described above in any one of 20 to 23 further includes a through via (42) which is formed passing through a plurality of interconnect layers, and a first non-through via (48) and a second non-through via (47) for connecting interconnect layers adjacent to each other. The plurality of interconnect layers include a first interconnect layer (L5) in which a first signal line (40) is formed, and a second interconnect layer (L4), provided at an upper side of the first interconnect layer when seen in a cross-sectional view, in which a first interconnect land (43) is formed. Further, the plurality of interconnect layers include a third interconnect layer (L3), provided at an upper side of the second interconnect layer when seen in a cross-sectional view, in which a second interconnect land (44) is formed, and a fourth interconnect layer (L2), provided at an upper side of the third interconnect layer when seen in a cross-sectional view, in which a second interconnect (41) is formed. The first interconnect land and the second interconnect land are connected to each other through the through via. The first interconnect land and the first interconnect are connected to each other through the first non-through via, and the second interconnect land and the second interconnect are connected to each other through the second non-through via. The metal pattern (49) is formed in a fifth interconnect layer (L1) provided at an upper side of the fourth interconnect layer so as to overlap the through via when seen in a plan view.

According to this, since the scattered electromagnetic waves generated at the joint between the interconnect land located at the upper side of the through via and the interconnect can be efficiently removed, it is possible to greatly alleviate a deterioration in signal transmission performance.

[25] (Metal Pattern: Disposition Immediately Above Through Via)

The semiconductor device as described above in any one of 16 to 19, wherein the board further includes a through via (42) which is formed passing through a plurality of interconnect layers, and a first non-through via (48) and a second non-through via (47) for connecting interconnect layers adjacent to each other. The plurality of interconnect layers include a first interconnect layer (L5) in which a first signal line (40) is formed, and a second interconnect layer (L4), provided at an upper side of the first interconnect layer when seen in a cross-sectional view, in which a first interconnect land (43) is formed. Further, the plurality of interconnect layers include a third interconnect layer (L3), provided at an upper side of the second interconnect layer when seen in a cross-sectional view, in which a second interconnect land (44) is formed, and a fourth interconnect layer (L2), provided at an upper side of the third interconnect layer when seen in a cross-sectional view, in which a second interconnect (41) is formed. The first interconnect land and the second interconnect land are connected to each other through the through via. The first interconnect land and the first interconnect are connected to each other through the first non-through via, and the second interconnect land and the second interconnect are connected to each other through the second non-through via. The metal pattern (49) formed in a fifth interconnect layer (L1) is provided at an upper side of the fourth interconnect layer so as to overlap the through via when seen in a plan view.

According to this, since the scattered electromagnetic waves generated at the joint between the interconnect land located at the upper side of the through via and the interconnect can be efficiently removed, it is possible to greatly alleviate a deterioration in signal transmission performance.

2. Explanation of Description Form, Basic Terminology, and Use thereof in the Present Application In the present application, if necessary, for the sake of convenience, an embodiment may be divided into a plurality of sections in the description thereof. However, they are by no means independent of or distinct from each other unless particularly explicitly described otherwise, and one of the individual parts of a single example is details, variations, and so forth of part or the whole of the others. In principle, the repetition of like portions will be omitted. Each constituent element in the embodiment is not indispensable unless particularly explicitly described otherwise, unless the constituent element is theoretically limited to a specific number, or unless it is obvious from the context that the constituent element is indispensable.

Further, in case that the term "semiconductor device" or "semiconductor integrated circuit device" as used herein is mentioned in the present application, the device principally refers to a semiconductor device or semiconductor integrated circuit in which, in addition to various single-element transistors (active elements) and various transistors which are main components, resistors, capacitors, and the like are integrated over a semiconductor chip or the like (such as, for example, a mono-crystalline silicon substrate), or in which a semiconductor chip or the like is packaged. Here, as an exemplary representative of the various transistors, there can be shown a Metal Insulator Semiconductor Field Effect Transistor (MISFET) represented by a Metal Oxide Semiconductor Field Effect Transistor (MISFET). At this time, as an exemplary representative of an integrated circuit structure, there can be illustrated a Complementary Metal Insulator Semiconductor (CMIS) integrated circuit represented by a Complementary Metal Oxide Semiconductor (CMOS) integrated circuit which is a combination of an N-channel MISFET and a P-type MISFET.

Likewise, even in case that such wording as "X comprised of A" is used in association with a material, a composition, or the like in the description of the embodiment or the like, it does not exclude a material, a composition, or the like which contains an element other than A as one of the main constituent elements thereof unless particularly explicitly described otherwise, or unless it is obvious from the context that it excludes such a material, a composition, or the like. For example, in case that a component is mentioned, the wording means "X containing A as a main component" or the like. It goes without saying that, even in case that "silicon member" or the like is mentioned, it is not limited to pure silicon, and a member containing a SiGe alloy, another multi-element alloy containing silicon as a main component, another additive, or the like is also included.

Likewise, it goes without saying that, although a preferred example is illustrated in association with a graphical figure, a position, an attribute, or the like, the graphical figure, position, or attribute is not strictly limited thereto unless particularly explicitly described otherwise, or unless it is obvious from the context that the graphical figure, position, or attribute is strictly limited thereto.

Further, in case that a specific numerical value or numerical amount is mentioned, it may be either more or less than the specific numerical value unless particularly explicitly described otherwise, unless the numerical value is theoretically limited to the number, or unless it is obvious from the context that the numeral value is limited to the number.

In case that the term "wafer" as used herein is mentioned, it typically refers to a mono-crystalline silicon wafer on which a semiconductor integrated circuit device (the same is true of a semiconductor device or an electronic device) is formed, but it goes without saying that the "wafer" also includes a composite wafer of an insulating substrate and a semiconductor layer or the like, such as an epitaxial wafer, a SOI substrate, or an LCD glass substrate.

The term "solder" as used herein is generally a low-melting-point (approximately less than 250 degrees Celsius) metal material containing tin as one of main components. The "solder" includes a "lead-containing solder" which contains lead, and a "lead-free solder" which does not contain lead. In the present application, as an example, the solder bump is used as a lead-free solder. The lead-free solder includes, for example, a tin-based lead-free solder containing tin as a main component.

3. Further Detailed Description of the Embodiments

An embodiment of the present invention will be further described in detail. In each of the drawings, the same or similar portions are denoted by the same or similar marks or reference numerals, and a description thereof will not be repeated in principle. In the accompanying drawings, hatching or the like may be omitted even in a cross section in case that hatching or the like results in complicated illustration or in case that the distinction between the section to be hatched and a vacant space is distinct. In relation thereto, even a two-dimensionally closed hole may have a background outline thereof omitted in case that it is obvious from the description or the like that the hole is two-dimensionally closed and so on. Further, even a portion other than a cross section may be hatched to clearly show that the hatched portion is not a vacant space.

First Embodiment

Figure 2:
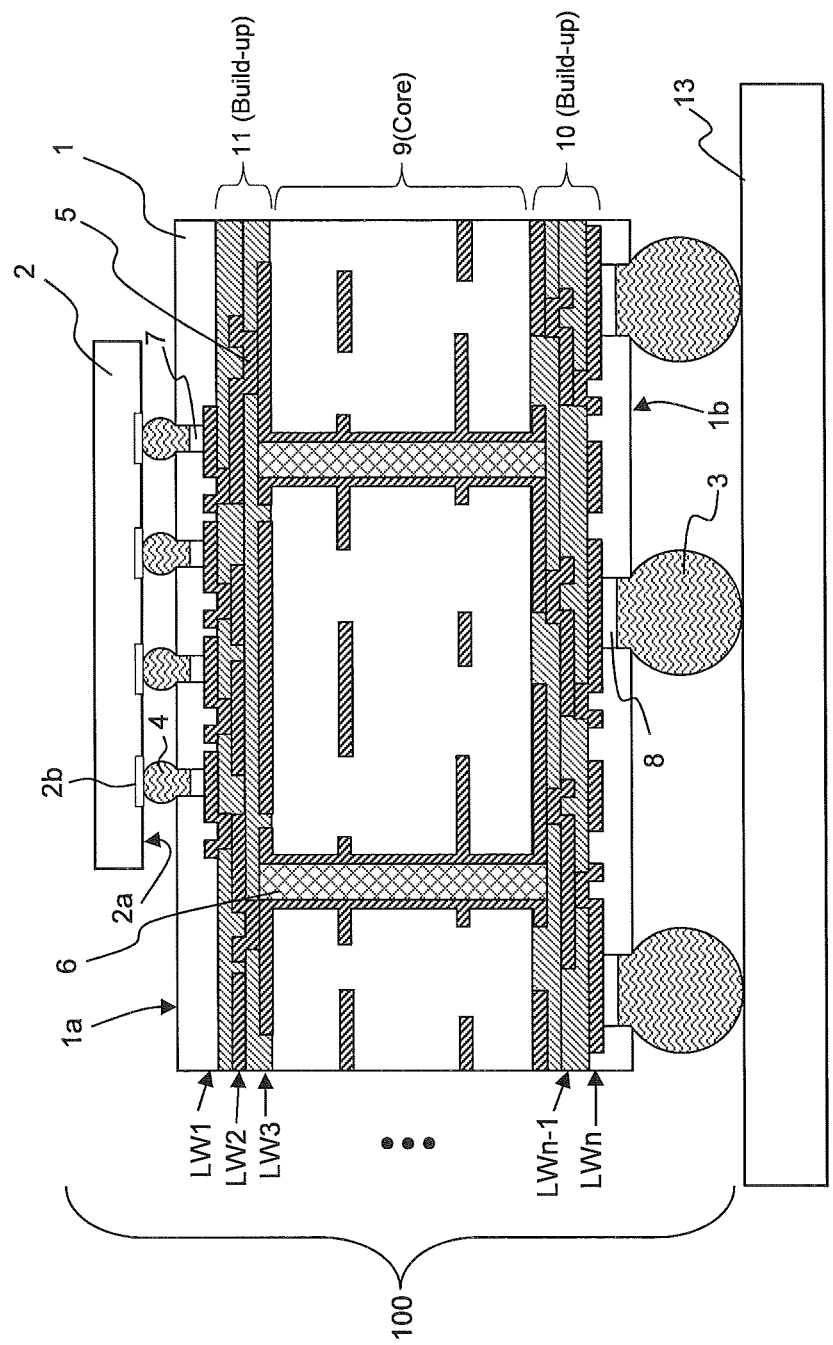
FIG. 2 is a schematic cross-sectional view illustrating the entire semiconductor device according to an embodiment of the present application.

FIG. 2 is a schematic cross-sectional view illustrating the entire semiconductor device according to an embodiment of the present application. The semiconductor device shown in the same drawing is, for example, a semiconductor device for handling a high-frequency (for example, 10 GHz or more) signal, and is, for example, a semiconductor device mounted to a communicator device, a high-speed communication router or the like in a base station of a cellular phone. Here, as a package form of the semiconductor device, a specific description will be given by taking an example of a FCBGA (Flip Chip Ball Grid Array) type package which has a solder bump being applied to a semiconductor chip and is connected facedown onto a circuit board. Meanwhile, the number of bump electrodes or the like of the semiconductor device 100 shown in the same drawing is smaller than in reality, for convenience of illustration. As an example, the actual bump pitch is appropriately 100 micrometers on a chip, and appropriately 1 millimeter on an external bump.

As shown in FIG. 2, the semiconductor device 100 is configured to include, for example, a semiconductor chip 2, a plurality of external terminals 3, and an interposer (circuit board) 1 for electrically connecting the semiconductor chip 2 and the external terminal 3. The semiconductor device 100 is mounted onto a mounting substrate (printed board) 13 through the external terminal 3, and is electrically connected to another circuit element located on the mounting substrate. The semiconductor device 100 is assembled, for example, in the following order.

Figure 3:
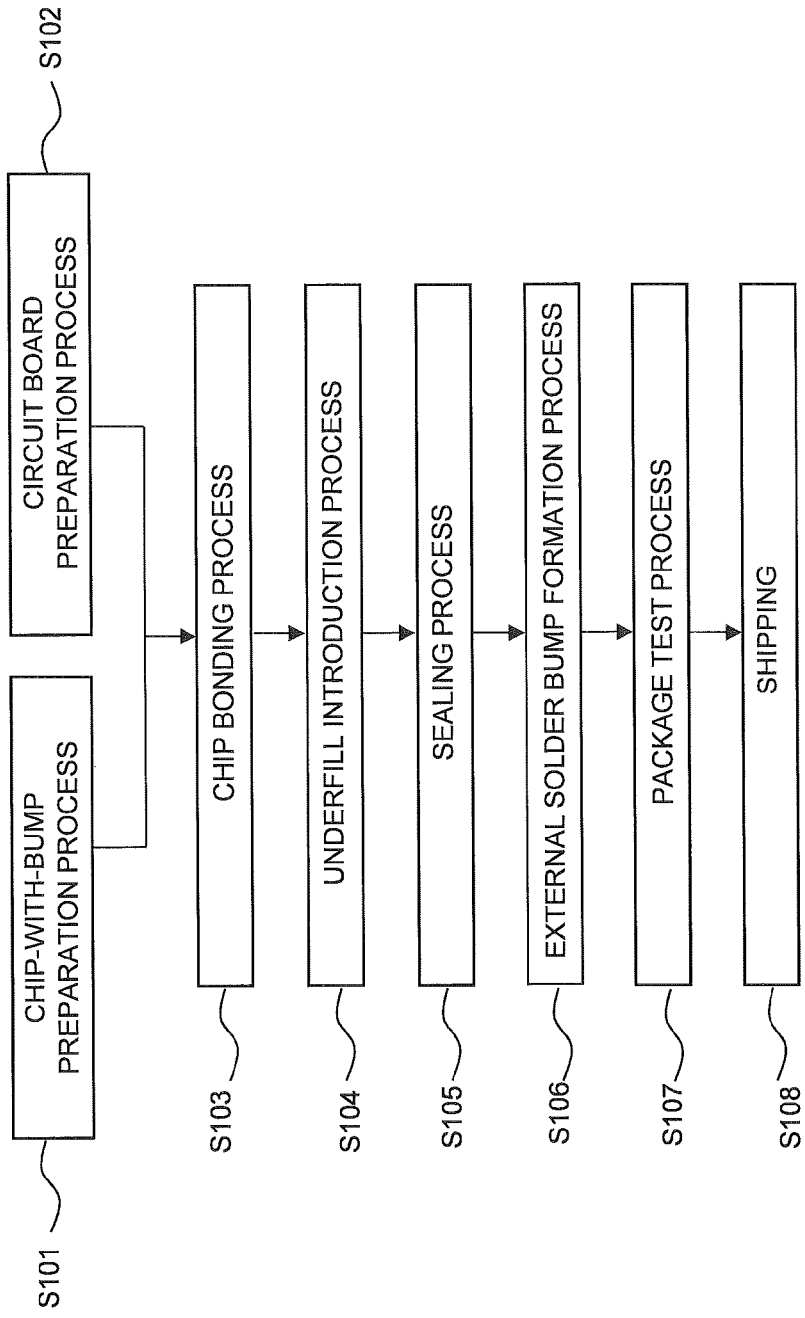
FIG. 3 is a flow diagram illustrating an outline of a process of manufacturing the semiconductor device according to an embodiment of the present application.

FIG. 3 is a flow diagram illustrating an outline of a process of manufacturing the semiconductor device according to an embodiment of the present application.

In the following example, a detailed description will be given by taking an example of a solder bump, but it goes without saying that the solder bump may be a gold (Au) bump, a copper (Cu) bump, and other metal bump (metal bump) electrodes.

Meanwhile, in the following example, a detailed description will be given by taking an example of a process of introducing an underfill resin after flip-chip bonding, but it goes without saying that a process of mounting an underfill resin before flip-chip bonding and then performing the flip-chip bonding may be used.

As shown in FIG. 3, first, a semiconductor chip with a bump is prepared (S101). In a solder bump formation process preceding a preparation process of the semiconductor chip with a bump, first, a large number of electrode pads 2b (UBM or the like) are provided in a device surface 2a of a wafer in which a predetermined circuit pattern is formed, and a solder bump 4 is formed thereon. Thereafter, the wafer is divided into respective chips through a wafer probe test process, a bump height test process, and a wafer dicing process. Thereby, the semiconductor chip with a bump is obtained.

In addition, the interposer (circuit board) 1 is prepared (S102). The circuit board 1 is, for example, a build-up board. In a circuit board manufacturing process preceding a circuit board preparation process, the circuit board is obtained by a manufacturing process of vertically laminating two layers of boards, and securing electrical conduction by opening a via in each case. A method of manufacturing the circuit board will be described later in detail.

Next, the circuit board and the semiconductor chip are electrically connected to each other by the chip bonding process (flip-chip bonding process) (S103). Specifically, in the chip bonding process, the electrode pad 2b on the semiconductor chip 2 and a first electrode (pad) 7 on the circuit board 1 corresponding thereto are connected to each other by performing a reflow process, for example, at appropriately 240 degrees Celsius to 260 degrees Celsius.

Next, an underfill resin member is injected between the first main surface (upper surface) 1a of the circuit board 1 and the device surface 2a of the semiconductor chip 2, and a curing process is performed (S104). The upper surface of the circuit board 1, and the semiconductor chip 2 are then sealed by a sealing resin substance (epoxy), and are packaged (S105). Thereafter, an external solder bump (solder ball) as the external terminal 3 is attached to a second electrode (solder ball pad) 8 of a second main surface (lower surface) 1b of the circuit board 1 (S106). The semiconductor device 100 packaged in the above-mentioned process goes through a marking process of performing marking on the upper surface of a sealing substance, and then a package test is performed (S107). The semiconductor device passing through a package test process is packed and shipped through an appearance inspection (S108).

A description will be given again returning to FIG. 2. In the same drawing, as the circuit board 1, a build-up board having build-up layers 10 and 11 made of an insulating resin being attached to both sides of a core layer 9 using a four-layer glass epoxy board as a core is illustrated as an example.

The build-up layers 10 and 11 are formed of, for example, a two-layer insulating resin. The circuit board 1 includes the first main surface 1a in which a plurality of first electrodes 7 for electrically connecting the semiconductor chip 2 through the solder bump 4 are formed, and the second main surface 1b, facing the first main surface, in which a plurality of second electrodes (solder ball pads) 8 for electrically connecting the external terminal (solder ball) 3 is formed. A material of the solder ball 3 can include, for example, a silver-added tin-based lead-free solder (melting point: appropriately 221 degrees Celsius) to which silver of appropriately 1.5 wt % is added, as a preferred material. Meanwhile, various types of materials can be applied to the lead-free solder, in addition to the above-mentioned example. In addition, a lead-based solder can be used insofar as circumstances permit, but it is advantageous to use a lead-free solder in view of the environment.

A plurality of interconnect layers LW1 to LWn (n is an integer equal to or greater than 2) for forming a plurality of signal paths that electrically connect the first electrode 7 and the solder ball pad 8 corresponding thereto are formed between the first main surface 1a and the second main surface 1b (each of upper surface and lower surface of a plurality of core layers 9 and a plurality of build-up layers) in the circuit board 1.

A metal member and a metal pattern (hereinafter, referred to as an "electromagnetic wave absorber") for absorbing scattered electromagnetic waves are formed, as necessary, in the interconnect layers LW1 to LWn of the circuit board 1, separately from the signal line (interconnect pattern) for forming the signal path. Hereinafter, the electromagnetic wave absorber will be described in detail.

Signal electromagnetic waves traveling through the signal path are scattered in a portion in which the interconnect structure of the signal path is changed. Some of the scattered electromagnetic waves return in an original direction, and thus the portion in which the interconnect structure of the signal path is changed is observed as a portion having impedance discontinuity. That is, signal reflection does not arise due to the presence of impedance discontinuity, and some of the scattered electromagnetic waves returns in an original direction and thus impedance discontinuity is observed. From this, the present inventor has found that the removal of the scattered electromagnetic waves can extinguish impedance discontinuity, regardless of the sign (capacitive or inductive) of impedance discontinuity. Consequently, in the present embodiment, the electromagnetic wave absorber is dispersedly disposed in the vicinity of the portion in which the interconnect structure for forming a signal path in the interconnect layers LW1 to LWn is changed, at a distance shorter than the wavelength of a signal supplied to the signal path. Thereby, impedance discontinuity in the circuit board 1 is extinguished.

Figure 4:
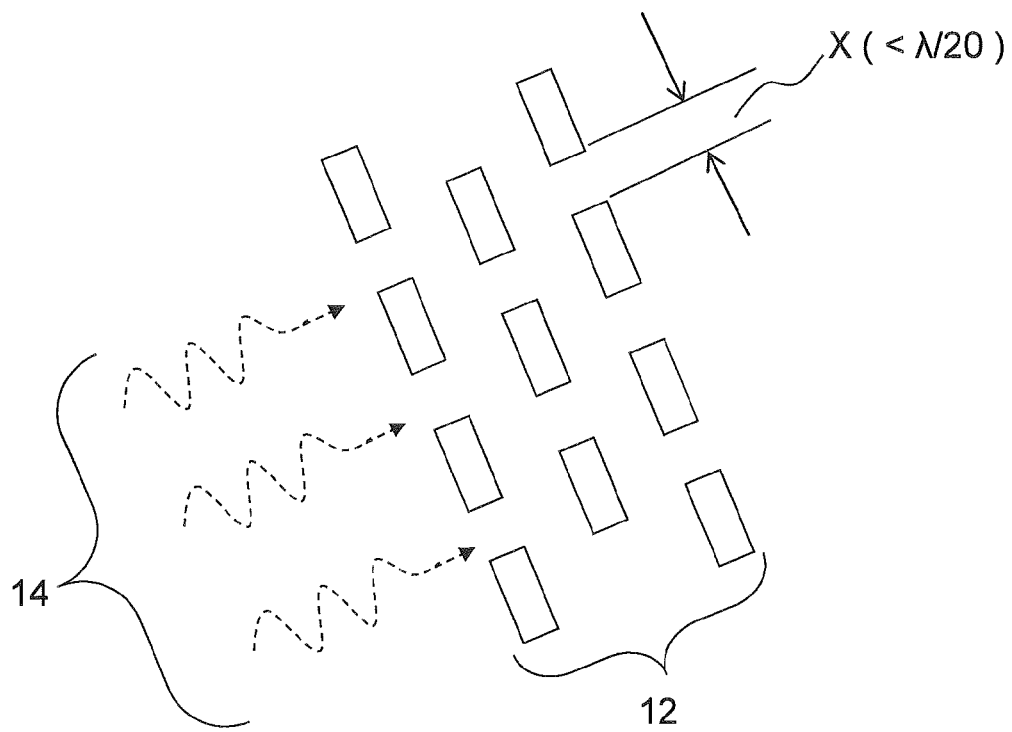
FIG. 4 is a diagram illustrating an example of an electromagnetic wave absorber.

FIG. 4 is a diagram illustrating an example of the electromagnetic wave absorber.

As shown in the same drawing, the electromagnetic wave absorber is formed of, for example, a plurality of metal pieces 12 which are separately disposed at a predetermined distance. Each of the metal pieces 12 is separated from another signal line or a return path (power source interconnect or ground interconnect) at high impedance. A distance between each of the metal pieces 12 (length of a portion in which the metal piece is not present) X is sufficiently smaller than the wavelength $\lambda$ of an electromagnetic wave equivalent to a signal band of a signal for the purpose of transmission. For example, each of the metal pieces 12 is separately disposed at a distance equal to or less than $\lambda/20$. Thereby, scattered electromagnetic waves 14 generated in the portion in which the interconnect structure of the signal path is changed cannot pass through a small gap between each of the metal pieces 12, and thus are absorbed in the metal pieces 12. The absorbed electromagnetic waves are converted into Joule heat by the surface resistance of the metal piece 12. For this reason, it is preferable to make the surface area of the metal piece 12 as large as possible. The shape of the metal piece 12 is not particularly limited in case that the shape has a surface area as large as possible. For example, in addition to a circular shape or a quadrangular shape, the shape may be a dendritic shape such as a snow crystal insofar as it can be manufactured. In addition, the electromagnetic waves are generally distributed three-dimensionally, and thus the metal piece is preferably disposed three-dimensionally insofar as it can be manufactured. For example, the portion in which impedance discontinuity is generated may be surrounded spherically by a plurality of metal pieces. The plurality of metal pieces 12 are formed of, for example, a paramagnetic metal member. For example, as the metal member, copper (Cu), aluminum (Al) or the like can be adopted. Although not particularly limited, in the circuit board 1 according to the present embodiment, the metal piece 12 is formed by the same metal member (for example, Cu) as that of the interconnect pattern formed in the interconnect layers LW1 to LWn.

Hereinafter, the shape, placement location and the like of the electromagnetic wave absorber will be described in detail by specific example.

Figure 5A:
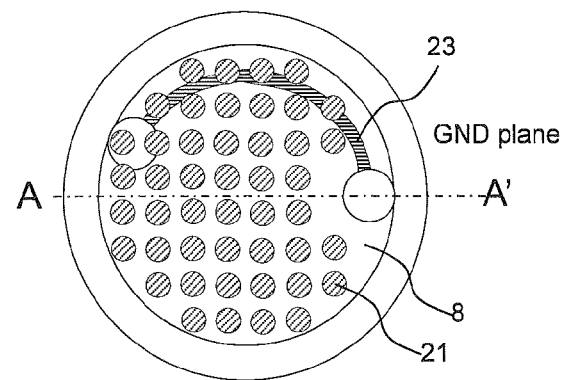
FIGS. 5A and 5B are diagrams illustrating a structure located in the vicinity of an external solder bump provided with the electromagnetic wave absorber.
Figure 5B:
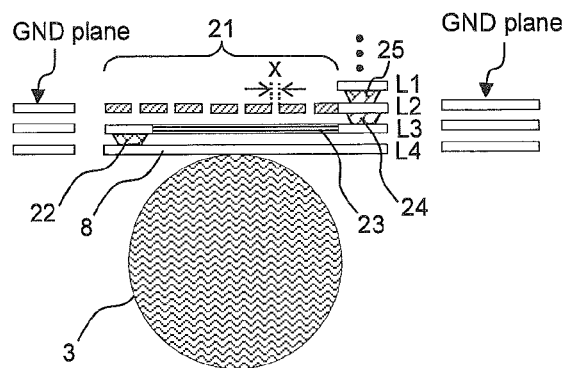

FIGS. 5A and 5B are diagrams illustrating a structure located in the vicinity of the external solder bump 3 provided with the electromagnetic wave absorber. FIG. 5A shows a schematic top view in the vicinity of the external solder bump 3 viewed from the first main surface 1a side of the circuit board 1, and FIG. 5B shows a schematic cross-sectional view of the circuit board 1 corresponding to cross-section A-A' of FIG. 5A. Meanwhile, in FIGS. 5A and 5B, only some of interconnect layers L1 to L4 of a plurality of interconnect layers LW1 to LWn are illustrated for convenience of illustration and description.

Figure 6A:
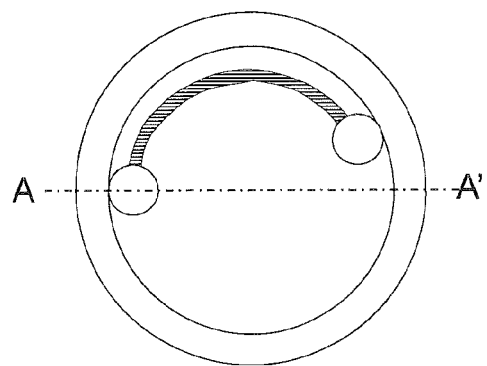
FIGS. 6A and 6B are diagrams illustrating a structure located in the vicinity of the external solder bump in case that the electromagnetic wave absorber is not present, as a comparative example of FIGS. 5A and 5B.
Figure 6B:
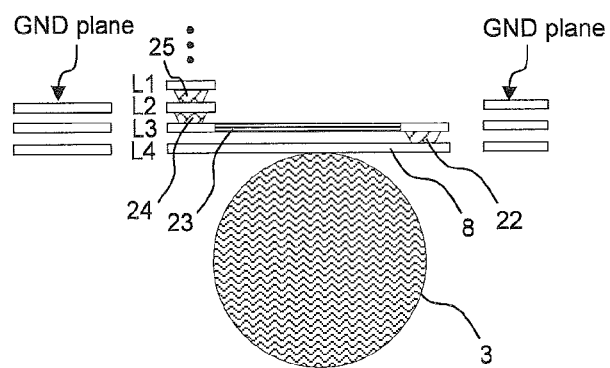

FIGS. 6A and 6B are diagrams illustrating a structure located in the vicinity of the external solder bump 3 in case that the electromagnetic wave absorber is not present, as a comparative example of FIGS. 5A and 5B. FIG. 5A shows a schematic top view in the vicinity of the external solder bump 3 viewed from the first main surface 1a side of the circuit board 1, and FIG. 5B shows a schematic cross-sectional view of the circuit board 1 corresponding to cross-section A-A' of FIG. 5A.

The layer structure of the circuit board 1 shown in FIGS. 5A and 5B and FIGS. 6A and 6B is configured as follows. For example, the circuit board 1 is constituted by, in order from the lowermost layer, the interconnect layer L4 in which the solder ball pad 8 is formed, the interconnect layer L3 in which an inductor pattern 23 is formed, the interconnect layer L2 in which the electromagnetic wave absorber (only FIGS. 5A and 5B) and a ground plane are formed, the interconnect layer L1 in which a ground plane is formed, an interconnect layer (not shown) in which a differential signal line is formed, and an interconnect layer (not shown) in which a ground plane is formed. The respective layers are electrically connected to each other through a non-through via (via) formed by laser machining.

A non-through via 25 is provided between the interconnect layer L1 and the interconnect layer L2, and a non-through via 24 is provided between the interconnect layer L2 and the interconnect layer L3. The inductor pattern 23 is formed in the interconnect layer L3. A non-through via 22 is formed between the interconnect layer L3 and the interconnect layer L4. The solder ball pad 8 connected to the solder ball 3 is formed in the interconnect layer L4. Although not shown, the differential signal line having, for example, a length of 10 mm is formed in the interconnect layer located on the upper portion of the interconnect layer L1, and is connected through the non-through via 25. For example, a signal which is output from the semiconductor chip 2 is supplied to the differential signal line having a length of 10 mm, and is propagated from the differential signal line through the non-through via 25 and the non-through via 24 to the inductor pattern 23. The signal is output from the inductor pattern 23 through the non-through via 22 and the solder ball pad 8 to the solder ball 3.

In FIGS. 5A and 5B and FIGS. 6A and 6B, for example, in case that the frequency of the signal supplied to the differential signal line is sufficiently high, large signal reflection arises in the joint between the inductor pattern and the solder ball pad 8, and thus the scattered electromagnetic waves are generated. Thereby, the signal transmission performance of the signal path from the differential signal line to the solder ball 3 drastically deteriorates. Consequently, as shown in FIGS. 5A and 5B, a plurality of metal pieces 21 are formed in the interconnect layer L2 so as to overlap the solder ball pad 8, for example, when seen in a plan view. Thereby, the scattered electromagnetic waves generated in the joint between the inductor pattern 23 and the solder ball pad 8 cannot pass through a small gap between each of the metal pieces 21, and thus are absorbed by the metal pieces 21.

Figure 7A:
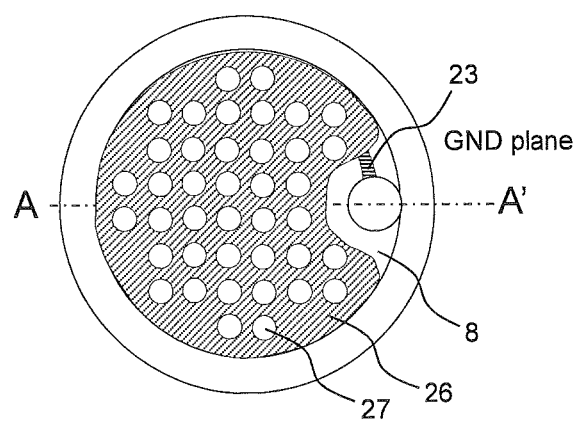
FIGS. 7A and 7B are diagrams illustrating a structure located in the vicinity of the external solder bump in which a mesh-shaped metal pattern is disposed instead of a plurality of metal pieces.
Figure 7B:
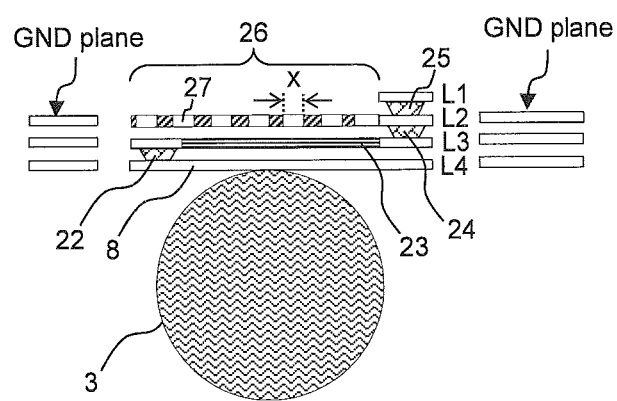

FIGS. 7A and 7B are diagrams illustrating a structure located in the vicinity of the external solder bump 3 in which a mesh-shaped metal pattern is disposed instead of the plurality of metal pieces 21 as the electromagnetic wave absorber. As shown in FIGS. 7A and 7B, a metal pattern 26 has a plurality of through holes 27, and thus is formed in a mesh shape. The diameter of the through hole 27 becomes sufficiently smaller than the wavelength $\lambda$ of an electromagnetic wave equivalent to a signal band of a signal for the purpose of transmission. For example, each of the through holes 27 has a diameter equal to or less than $\lambda/20$. According to this, as is the case with a case in case that the metal piece 21 is disposed, it is possible to absorb the scattered electromagnetic waves by the metal pattern 26. Meanwhile, in FIGS. 7A and 7B, a case where the through hole 27 is formed to be smaller than the non-through vias 22, 24, and 25, and the like is illustrated. However, in case that the through hole 27 and the non-through vias 22, 24, and 25 are formed at a minimum size of a process, the through hole 27 has substantially the same size as that of the non-through vias 22, 24, and 25.

FIG. 8 illustrates an outline of a manufacturing process of the circuit board 1.

As shown in FIG. 8, first, a core layer 9 having a copper clad prepreg being laminated on both sides of a both-sided copper clad plate in which an interconnect pattern is formed is prepared (S201). In the core layer 9, boring of a through hole is performed by drilling (S202). Thereafter, plating (electroless plating or electroplating) is performed on the through hole (S203). Next, hole plugging with a resin is performed and then an interlayer insulating film is formed on both sides (S204). Next, a non-through via for connection to an internal interconnect layer is formed by laser machining (S205). Further, electroless copper plating is performed on the entire surface at the thickness level of several μm (S206). The interconnect pattern and the pattern of the electromagnetic wave absorber are patterned with a dry film resist for interconnect formation using a photomask, and copper electroplating at the thickness level of 10 μl is performed on the opening (S207). Thereafter, the resist is removed and plated copper is dry-etched, and thus the interconnect and the electromagnetic wave absorber are formed (S208). Thereafter, a plurality of build-up layers are formed by repeating steps S204 to S207 mentioned above. In case that the number of interconnect layers required in the build-up layer is formed, a solder resist is formed as a surface protection film (S209). The first electrode 7 and the solder ball pad 8 which serve as a connection portion (pad) between the semiconductor chip 2 and the mounting substrate 13 are opened (S210). Finally, the circuit board 1 is completed by performing surface treatment on the opening (S211).

As mentioned above, the electromagnetic wave absorber can be formed by the same method as that in a case where the interconnect pattern is formed in the circuit board 1. In addition, the metal piece 21 and the metal pattern 26 used as the electromagnetic wave absorber can be formed in any interconnect layer of the interconnect layer in the core layer 9 and the interconnect layer in the build-up layers 10 and 11. However, in order to cope with even a higher signal frequency, the electromagnetic wave absorber is preferably formed in the interconnect layer in the build-up layers 10 and 11. For example, the interconnect layer in the core layer 9 is configured such that the interconnect pattern is formed by attaching a film. On the other hand, as shown in FIG. 8, the interconnect layer of the build-up layers 10 and 11 is configured such that the interconnect pattern is formed by a photolithography technique, and thus finer processing can be performed. In addition, a prepreg constituting the core layer 9 has a higher relative dielectric constant than that of the interlayer insulating film (resin) constituting the build-up layers 10 and 11. Therefore, in case that the metal piece 21 and the metal pattern 26 are formed in the interconnect layer in the core layer 9, the distance between the metal piece 21 and the metal pattern 26 is required to be made narrower than in a case where the metal piece and the metal pattern are formed in the interconnect layer in the build-up layers 10 and 11. From the above, the metal piece 21 and the metal pattern 26 are formed in the interconnect layer in the build-up layers 10 and 11, and thus it is possible to further increase the distance between the electromagnetic wave absorbers, and to easily correspond to a higher signal frequency.

Figure 9:
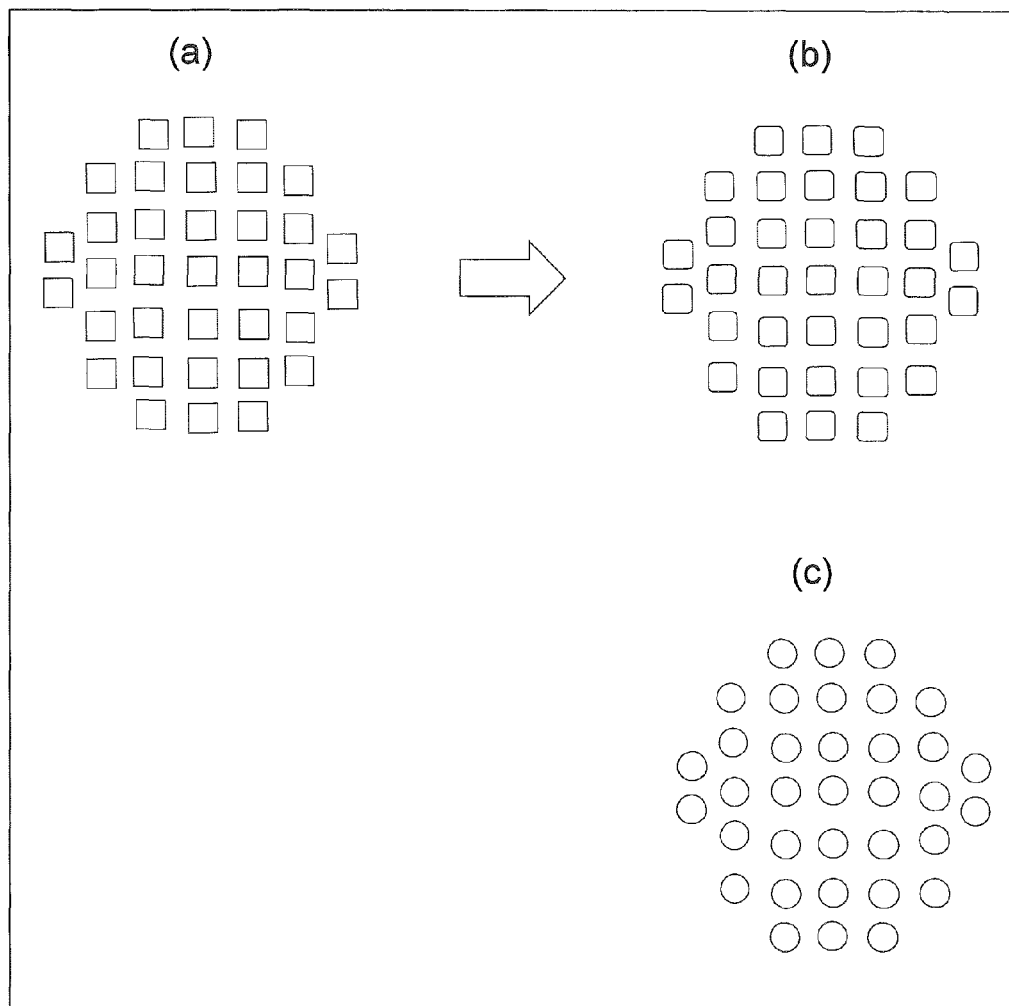
FIG. 9 is a diagram illustrating mask patterns for forming metal pieces used as the electromagnetic wave absorber, and shapes of the metal pieces formed thereby.
Figure 10:
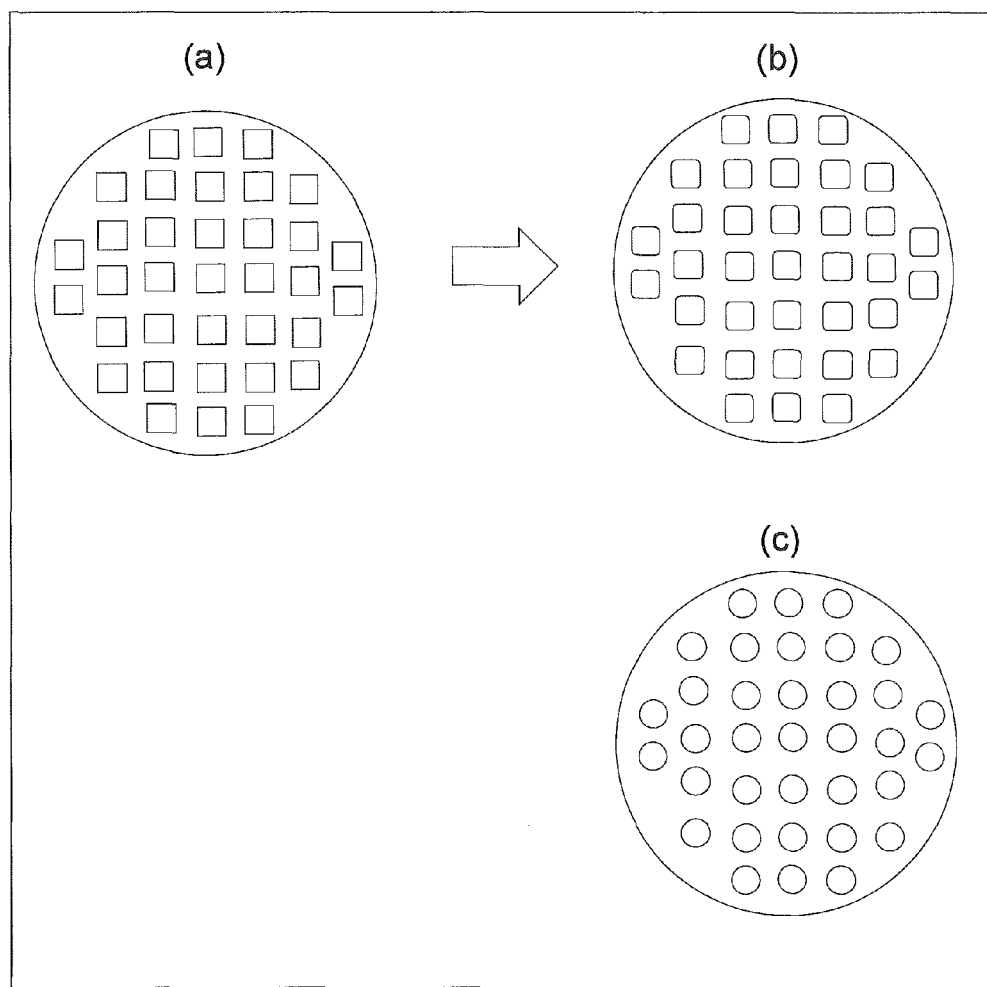
FIG. 10 a is diagram illustrating mask patterns for forming a mesh-shaped metal pattern used as the electromagnetic wave absorber, and shapes of the metal pattern formed thereby.

FIG. 9 is a diagram illustrating mask patterns for forming metal pieces used as the electromagnetic wave absorber, and shapes of the metal pieces formed thereby. FIG. 10 is a diagram illustrating mask patterns for forming a mesh-shaped metal pattern used as the electromagnetic wave absorber, and shapes of the metal pattern formed thereby.

As shown in a part (a) of FIG. 9, in case that a photomask of which the pattern shape corresponding to the metal piece is formed to be quadrangular is created, the quadrangular corner of the shape of the metal piece completed in reality has a rounded shape as shown in a part (b) of FIG. 9, but does not greatly influence a function as the electromagnetic wave absorber. For that reason, as shown in a part (c) of FIG. 9, the mask pattern may be formed in advance so that the shape of the metal piece becomes circular.

Similarly, as shown in a part (a) of FIG. 10, in case that a photomask of which the shape of the through hole is formed to be in a quadrangular shape is created, the quadrangular corner of the through hole completed in reality has a rounded shape as shown in a part (b) of FIG. 10, but does not greatly influence a function as the electromagnetic wave absorber. For that reason, as shown in a part (c) of FIG. 10, a mask pattern may be formed so that the shape of the through hole becomes circular in advance.

Figures 11, 12A:
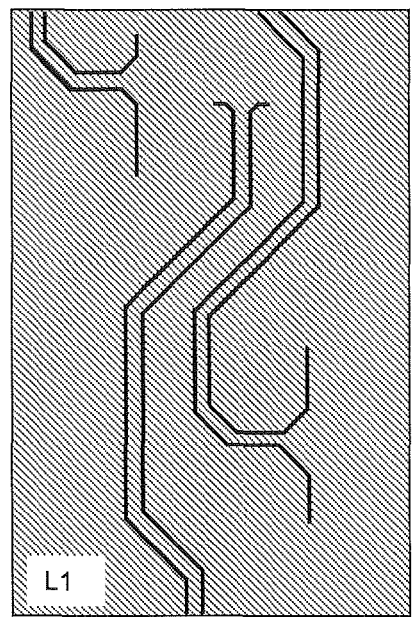
FIG. 11 is a diagram illustrating a signal frequency and a distance (mesh distance in a metal pattern) between the metal pieces corresponding thereto.
FIGS. 12A to 12D are diagrams illustrating layout examples of the circuit board in which the electromagnetic wave absorber is formed.

FIG. 11 is a diagram illustrating a signal frequency and a distance (mesh distance in the metal pattern 26) X between the metal pieces 21 corresponding thereto. In the same drawing, the distance between the metal pieces and the diameter (mesh distance) of the through hole in case that the dielectric constant of a resin constituting the build-up layer of the circuit board 1 is 3.2 is illustrated. As shown in the same drawing, in case that the frequency of a signal for the purpose of transmission is 1 GHz, the distance between the metal pieces and the mesh distance between the metal patterns 26 (hereinafter, simply referred to as the "distance between the electromagnetic wave absorbers") are preferably equal to or less than 8.0 mm. In case that the frequency of a signal is GHz, the distance between the electromagnetic wave absorbers is preferably equal to or less than 800 μm. In case that the frequency is 20 GHz, the distance is preferably equal to or less than 400 μm. The maximum frequency of a signal capable of absorbing the scattered electromagnetic waves is determined by the limitation of a fine processing technique for forming a transmission path. For example, as shown in FIG. 11, it is possible to cope with even a signal of 100 GHz insofar as processing can be performed up to 80 μm by the fine processing technique.

Figure 12B:
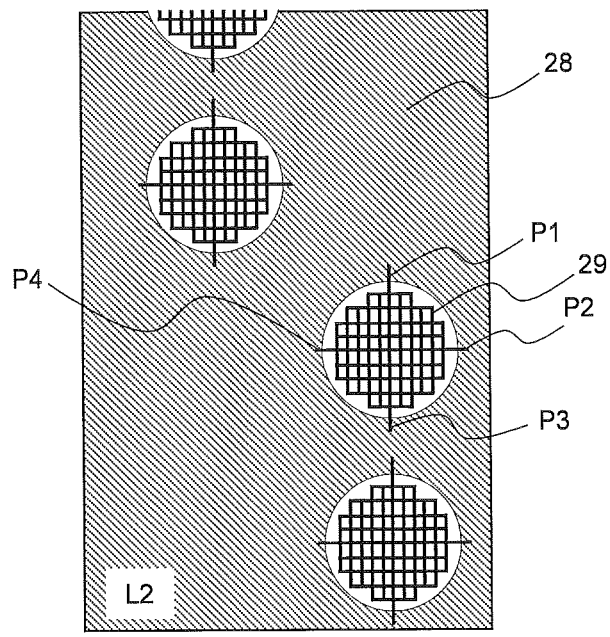
Figure 12C:
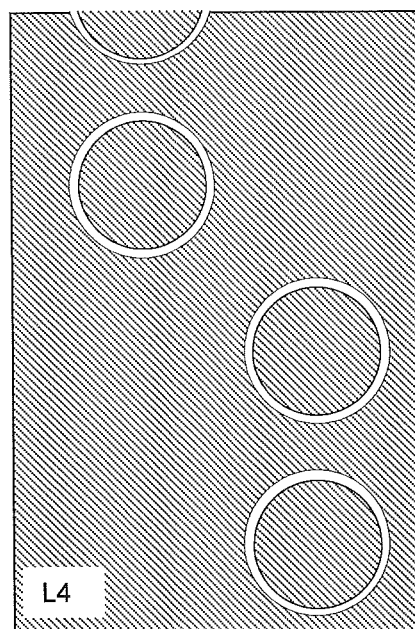
Figure 12D:
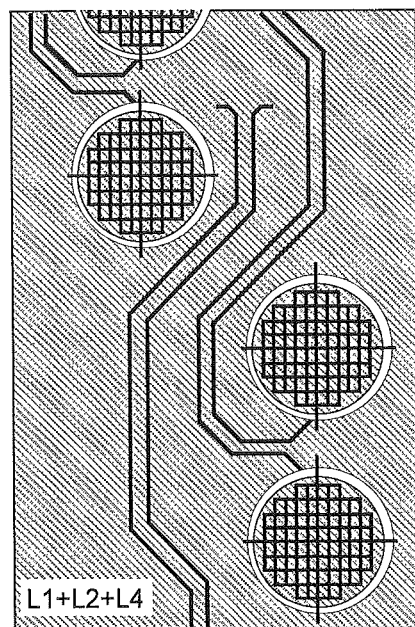

FIGS. 12A to 12D are diagrams illustrating a layout example of the circuit board in which the electromagnetic wave absorber is formed. In FIGS. 12A to 12D, as in FIGS. 7A and 7B mentioned above, a layout diagram is illustrated in which a mesh-shaped metal pattern 29 used as the electromagnetic wave absorber is formed so as to overlap the solder ball pad 8 connected to the differential signal path. Meanwhile, in FIGS. 12A to 12D, only the interconnect layers L1, L2, and L4 are illustrated for convenience of illustration. FIG. 12A illustrates a layout pattern of the interconnect layer L1, FIG. 12B illustrates a layout pattern of the interconnect layer L2, FIG. 12C illustrates a layout pattern of the interconnect layer L4, and FIG. 12D illustrates a layout pattern in case that the interconnect layers L1, L2, and L4 are overlapped with each other.

As shown in FIG. 12B, the metal pattern 29 is fixed at four points denoted by reference numerals and signs P1 to P4 so that the mesh-shaped metal pattern 29 is not peeled off. As mentioned above, the metal pattern 29 is preferably separated from another signal line or a return path (power source interconnect or ground interconnect). However, even in case that the metal pattern 29 is connected thereto in a solid ground pattern 28 and supports P1 to P4, the metal pattern does not greatly influence a function as the electromagnetic wave absorber insofar as the metal pattern is electrically connected thereto at high impedance in a high frequency band.

Figure 13A:
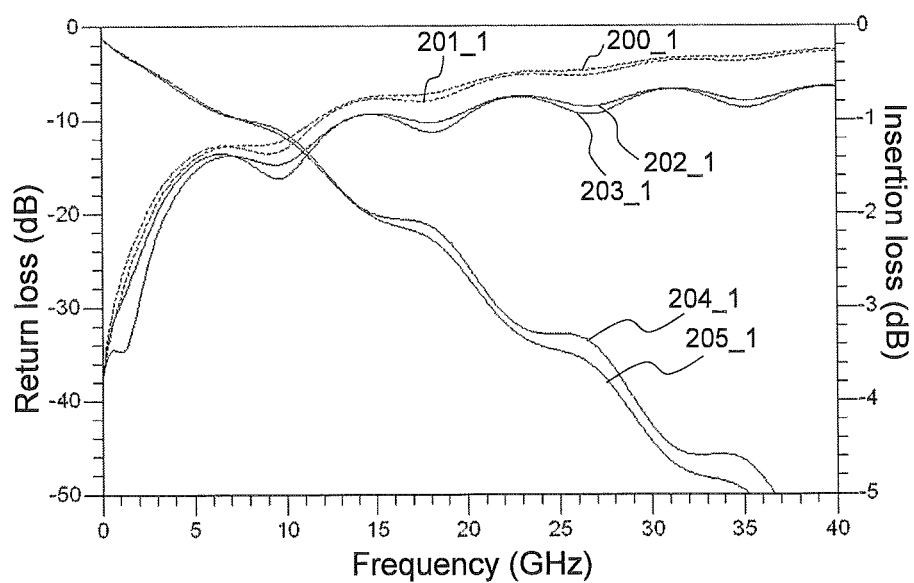
FIGS. 13A to 13C are characteristic diagrams illustrating signal transmission characteristics in case that the electromagnetic wave absorber is present or is not present.
Figure 13B:
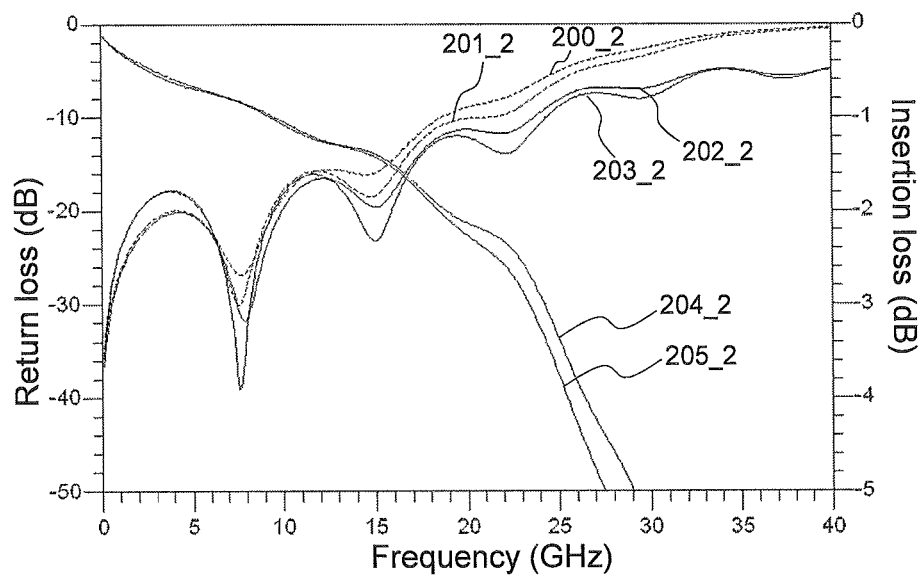
Figure 13C:
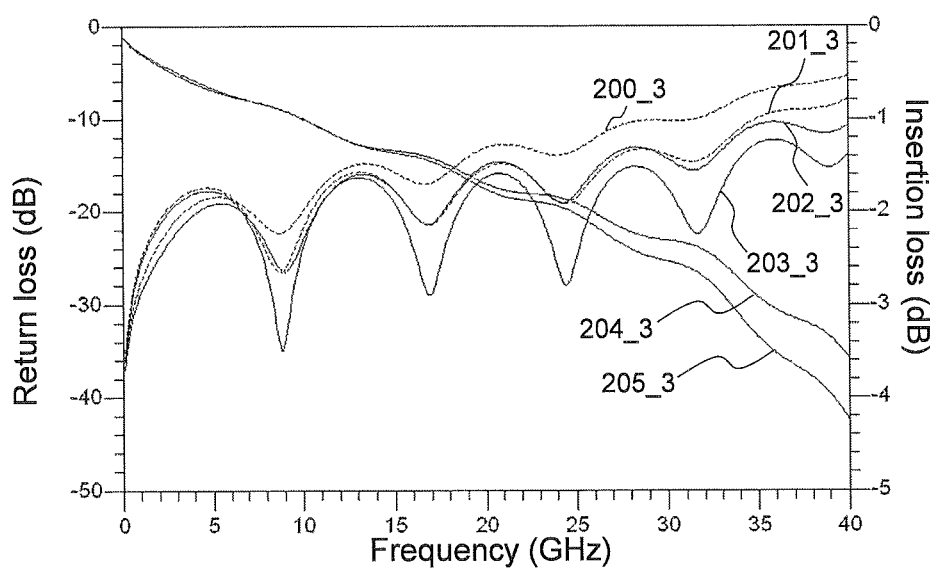

FIGS. 13A to 13C are characteristic diagrams illustrating signal transmission characteristics in case that the electromagnetic wave absorber is present or is not present. FIGS. 13A to 13C illustrate transmission characteristics of a signal path (hereinafter, referred to as a signal path Y) from the differential signal line formed on the upper layer of the interconnect layer L1 through the non-through vias 25, 24, and 22, the second electrode (solder ball pad) 8 or the like to the solder ball (external terminal) 3, in FIGS. 5A and 5B and FIGS. 6A and 6B mentioned above. FIGS. 13A to 13C illustrate, as specific transmission characteristics, the characteristics of a return loss with respect to a signal frequency and the characteristics of an insertion loss with respect to a signal frequency. FIG. 13A is a characteristic diagram in case that both the metal piece 21 and the inductor pattern 23 used as the electromagnetic wave absorber are not provided in FIGS. 5A and 5B. FIG. 13B is a characteristic diagram in case that the metal piece 21 is not provided and the inductor pattern 23 is provided as shown in FIGS. 6A and 6B. FIG. 130 is a characteristic diagram in case that both the metal piece 21 and the inductor pattern 23 are provided as shown in FIGS. 5A and 5B.

Reference numerals and signs 200_1 to 200_3 denote a return loss of the signal path Y in case that a signal is input from the upper layer side (differential signal line side) in a differential mode, and reference numerals 201_1 to 201_3 denote a return loss of the signal path Y in case that a signal is input from the upper layer side (differential signal line side) in a common mode. In addition, reference numerals 202_1 to 202_3 denote a return loss of the signal path Y in case that a signal is input from the lower layer side (solder ball 3 side) in a differential mode, and reference numerals 203_1 to 203_3 denote a return loss of the signal path Y in case that a signal is input from the lower layer side (solder ball 3 side) in a common mode. Further, reference numerals 204_1 to 204_3 denote an insertion loss of the signal path Y in a differential mode, and reference numerals 205_1 to 205_3 denote an insertion loss of the signal path Y in a common mode.

As shown by reference numerals 204_1, 205_1 of FIG. 13A, in case that both the metal piece 21 and the inductor pattern 23 are not present, the insertion loss increases as the frequency increases. On the other hand, in case that the inductor pattern 23 is added, as shown by reference numerals 204_2 and 205_2 of FIG. 13B, the insertion loss is improved further than that in reference numerals 204_1 and 205_1 in a range having a low frequency, but the insertion loss deteriorates drastically from a frequency of approximately 25 GHz. As mentioned above, this is because in case that the frequency becomes higher, large signal reflection arises in the connection portion between the inductor pattern 23 and the solder ball pad 8. On the other hand, in case that both the metal piece 21 and the inductor pattern 23 are provided, as shown by reference numerals 204_3 and 205_3 of FIG. 13C, it is possible to realize good signal transmission characteristics over a broad band without deteriorating the insertion loss even in the range of a high frequency. Meanwhile, although not shown, even in case that the metal pattern 26 is provided as shown in FIGS. 7A and 7B, the same characteristics as those in FIG. 13C are shown.

In FIGS. 5A and 5B mentioned above, a case where the inductor pattern 23 is further provided in addition to the plurality of metal pieces 21 is illustrated. However, even in case that only the metal piece 21 is provided without providing the inductor pattern 23, it is possible to realize good signal transmission characteristics over a broad band.

Figure 14:
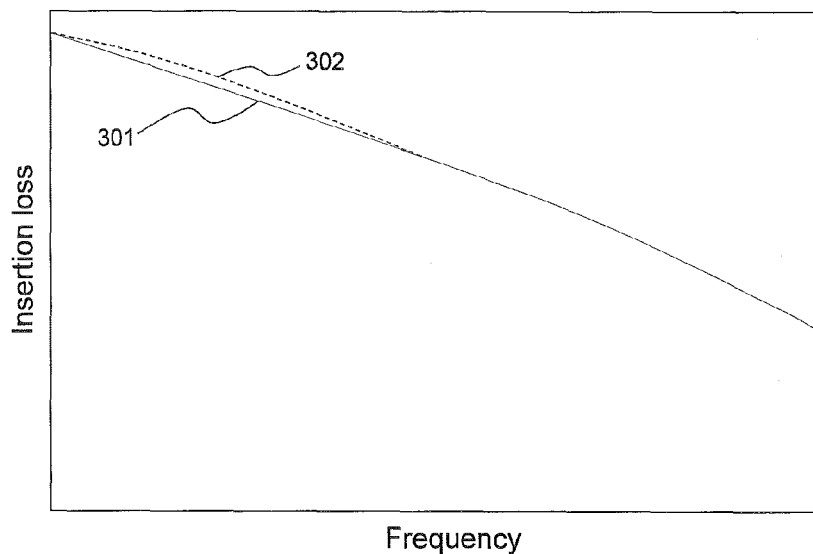
FIG. 14 is a characteristic diagram illustrating transmission characteristics in case that the electromagnetic wave absorber is provided, and then an inductor pattern is further inserted and is not inserted.

FIG. 14 is a characteristic diagram illustrating transmission characteristics in case that the electromagnetic wave absorber is provided, and then the inductor pattern 23 is further inserted and is not inserted. In the same drawing, reference numeral 301 denotes an insertion loss in case that only the metal piece 21 is provided without inserting the inductor pattern 23, and reference numeral 302 denotes an insertion loss in case that the inductor pattern 23 is inserted and the metal piece 21 is provided. As shown in the same drawing, it is understood that the insertion of the inductor pattern 23 shows good insertion loss characteristics in a low frequency band of up to approximately 5 GHz, but any case shows the same characteristics at a high frequency band.

Figure 15A:
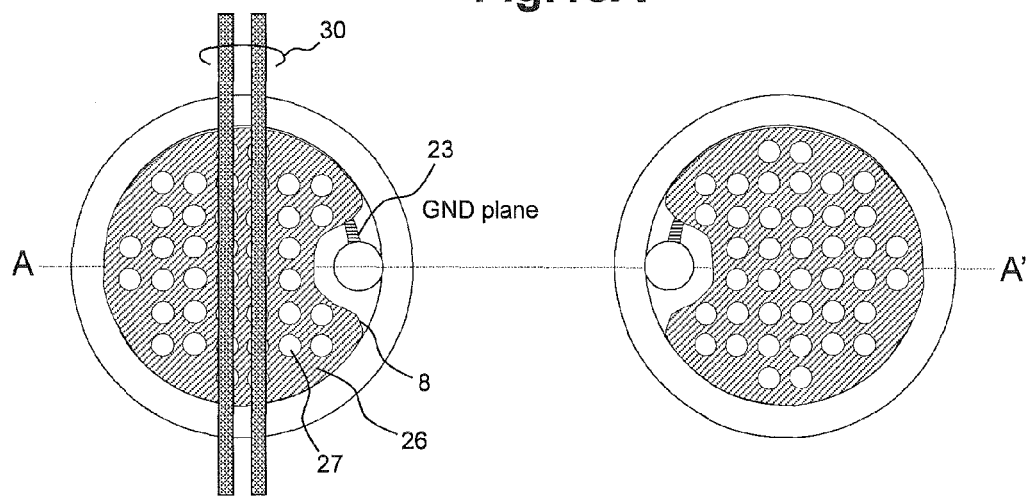
FIGS. 15A and 15B are diagrams illustrating an arrangement example of the electromagnetic wave absorber and another signal interconnect.
Figure 15B:
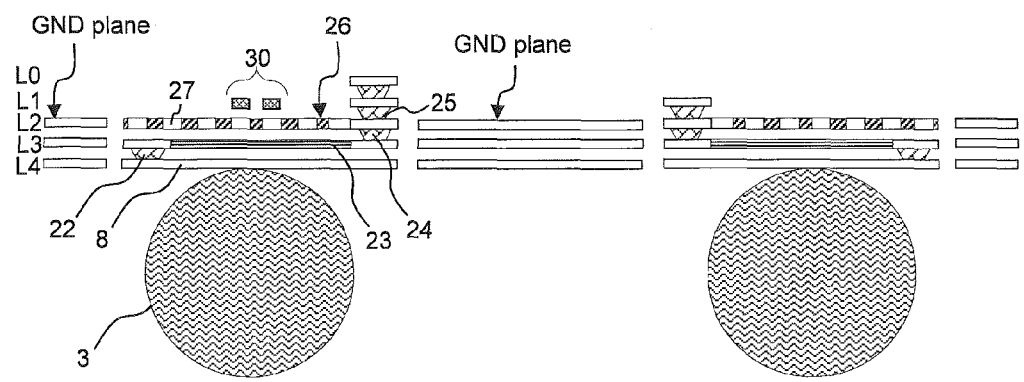

FIGS. 15A and 15B show an arrangement example of the electromagnetic wave absorber and another signal interconnect. In FIGS. 15A and 15B, a case where a differential signal line pair 30 different from the signal line connected to the solder ball (external terminal) 3 is formed immediately above the solder ball pad 8 is illustrated. FIG. 15A shows a schematic top view in the vicinity of the external solder bump 3 viewed from the first main surface 1a side of the circuit board 1, and FIG. 15B shows a schematic cross-sectional view of the circuit board 1 corresponding to cross-section A-A' of FIG. 15A. Meanwhile, in FIGS. 15A and 15B, only some of the interconnect layers are illustrated for convenience of illustration and description.

The circuit board 1 shown in FIGS. 15A and 15B has the following interconnect structure. For example, the circuit board 1 is constituted by, in order from the lowermost layer, the interconnect layer L4 in which the solder ball pad 8 is formed, the interconnect layer L3 in which the inductor pattern is formed, the interconnect layer L2 in which the electromagnetic wave absorber 26 and a ground plane are formed, the interconnect layer L1 in which the differential signal line pair 30 is formed, and an interconnect layer L0 in which a ground plane is formed. The differential signal line pair 30 is formed so as to pass immediately above the metal pattern 26.

The differential signal line pair 30 has a micro-strip line structure, for example, in a range located immediately above the electromagnetic wave absorber 26, and has a strip line structure in other ranges. Generally, in the differential signal line pair, there is the difference between such structures, signal transmission characteristics deteriorate due to the generation of impedance discontinuity at the boundary therebetween, and thus crosstalk occurs between different signal paths (for example, inductor pattern 23). However, as shown in FIGS. 15A and 15B, the electromagnetic wave absorber 26 is disposed between the solder ball pad 8 and the differential signal line pair 30, and thus it is possible to suppress the deterioration of signal transmission characteristics, and to suppress the generation of crosstalk.

Figure 16:
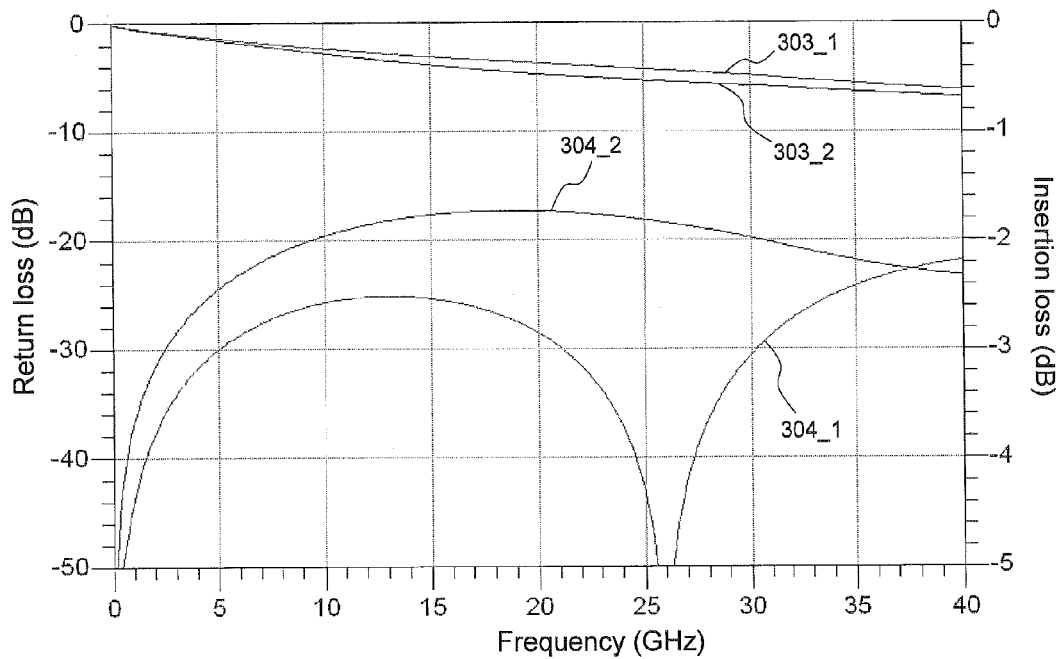
FIG. 16 is a characteristic diagram illustrating the transmission characteristics of a differential signal line pair in a structure of FIGS. 15A and 15B.

FIG. 16 illustrates the transmission characteristics of the differential signal line pair 30 in the structure of FIGS. 15A and 15B. FIG. 16 illustrates, as signal transmission characteristics, the characteristics of a return loss with respect to a signal frequency, and the characteristics of an insertion loss with respect to a signal frequency. In FIG. 16, reference numeral 303_1 denotes an insertion loss of the differential signal line pair 30 in a differential mode, and reference numeral 303_2 denotes an insertion loss of the differential signal line pair 30 in a common mode. In addition, reference numeral 304_1 denotes a return loss of the differential signal line pair 30 in a differential mode, and reference numeral 304_2 denotes a return loss of the differential signal line pair 30 in a common mode. It is understood from FIG. 16 that impedance discontinuity is reduced by the electromagnetic wave absorber 26 disposed immediately below the differential signal line pair, and an electromagnetic field is shielded by the inductor pattern 23 provided in the interconnect layer thereunder, thereby allowing the deterioration of transmission characteristics to be suppressed.

As mentioned above, the metal pattern 26 having a plurality of metal pieces 21 or through holes used as the electromagnetic wave absorber is formed in the circuit board 1, and thus it is possible to eliminate impedance discontinuity regardless of the sign (capacitive or inductive) of impedance discontinuity. In addition, a method of absorbing the scattered electromagnetic waves by the electromagnetic wave absorber as in the present embodiment is a principle of extinguishing impedance discontinuity by the direct action thereof on an electromagnetic field within a dielectric substance. Therefore, unlike a method of adding reverse impedance discontinuity into a transmission path in order to cancel impedance discontinuity as in the related art, an increase in frequency does not reduce the effect thereof. That is, it is possible to obtain an effect within a range in which Maxwell's equation is established. Therefore, according to the circuit board and the semiconductor device of the present embodiment, it is possible to realize good signal transmission characteristics over a broad band without deteriorating signal transmission performance at a high frequency.

Other specific examples of the shape, the arrangement and the like of the above-mentioned electromagnetic wave absorber are shown in the following second and sixth embodiments.

Second Embodiment

FIGS. 17A to 17C are diagrams illustrating the electromagnetic wave absorber provided in the vicinity of a through hole. FIG. 17A shows a schematic perspective view of the circuit board 1 located in the vicinity of the through hole, FIG. 17B shows a schematic top view in the vicinity of the through hole viewed from the first main surface 1a side of the circuit board 1, and FIG. 17C shows a schematic cross-sectional view of the circuit board 1 corresponding to cross-section A-A' of FIG. 17A. In FIGS. 17A to 17C, only some of interconnect layers L1 to L5 of the interconnect layers LW1 to LWn are illustrated for convenience of illustration and description.

The layer structure of the circuit board 1 shown in FIGS. 17A to 17C is configured as follows. For example, the circuit board 1 is constituted by the interconnect layer L5 in which a differential signal line pair 40 is formed, the interconnect layer L4 in which an interconnect land 43 connected to the lower side of a through hole 42 is formed, the interconnect layer L3 in which an interconnect land 44 connected to the upper side of the through hole 42 is formed, the interconnect layer L2 in which an electromagnetic wave absorber 45 and a differential signal line pair 41 are formed, and the interconnect layer L1 in which a ground plane 46 is formed.

The differential interconnect pair 40 in the interconnect layer L5 and the interconnect land 43 in the interconnect layer L4 are electrically connected to each other through non-through via 48, and the differential interconnect pair 41 in the interconnect layer L2 and the interconnect land 44 in the interconnect layer L3 are electrically connected to each other through a non-through via 47. A prepreg constituting the core layer 9 is formed between the interconnect layer L3 and the interconnect layer L4, and a through hole (through via) 42 is formed in a portion of the region thereof by drilling. The interconnect land 43 and the interconnect land 44 are electrically connected to each other through the through hole 42.

For example, a signal which is output from the semiconductor chip 2 is supplied to the differential signal line pair 41, and is propagated from the differential signal line pair 41 through the non-through via 47, the interconnect land 44, the through hole 42, the interconnect land 43, and the non-through via 48 to the differential signal line pair 40.

As shown in FIGS. 17A to 17C, a plurality of metal pieces 45 used as the electromagnetic wave absorber are formed in the interconnect layer L2 so as to overlap the through hole 42 (interconnect land 44), for example, when seen in a plan view. According to this, since scattered electromagnetic waves generated in the connection surface between the differential signal line pair 41 and the interconnect land 44 are absorbed by the plurality of metal pieces 45, it is possible to eliminate impedance discontinuity in a signal path from the differential signal line pair 41 to the differential signal path 40.

Further, a plurality of metal pieces used as the electromagnetic wave absorber may be disposed in a position of reference numeral 39 in the interconnect layer L5 (position overlapping the through hole 42 (interconnect land 43) when seen in a plan view). According to this, since the scattered electromagnetic waves generated at the joint between the interconnect land 43 located at the lower side of the through via 42 and the differential signal line pair 40 can be efficiently removed, it is possible to further alleviate a deterioration in signal transmission performance.

FIGS. 18A to 18C are diagrams illustrating another electromagnetic wave absorber provided in the vicinity of the through hole. FIGS. 18A to 18C illustrate a case where a mesh-shaped metal pattern 49 having a plurality of through holes 38 used as the electromagnetic wave absorber is disposed instead of plurality of metal pieces 45 mentioned above.

Specifically, the layer structure of the circuit board 1 shown in FIGS. 18A to 18C is configured as follows. The circuit board 1 is constituted by the interconnect layer L5 in which the differential signal line pair 40 is formed, the interconnect layer L4 in which the interconnect land 43 is formed, the interconnect layer L3 in which the interconnect land 44 is formed, the interconnect layer L2 in which the differential signal line pair 41 is formed, the interconnect layer L1 in which the electromagnetic wave absorber (metal pattern) 49 is generated, and the interconnect layer L0 in which the ground plane 46 is formed.

According to this, as is the case with a case where the plurality of metal pieces 45 are disposed, it is possible to absorb the scattered electromagnetic waves by the metal pattern 49, and to eliminate impedance discontinuity in a signal path from the differential signal line pair 41 to the differential signal path 40.

Third Embodiment

Figure 19A:
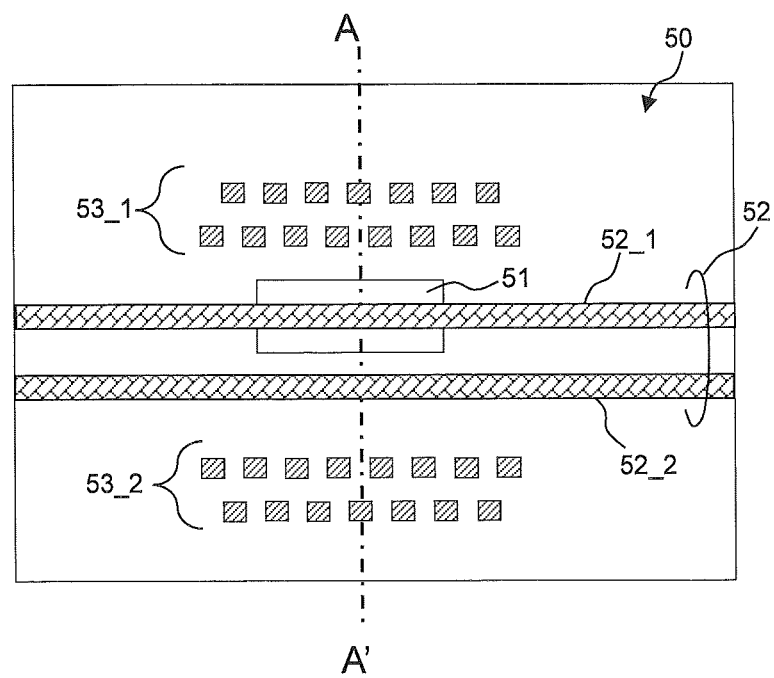
FIGS. 19A and 19B are diagrams illustrating the electromagnetic wave absorber disposed in the vicinity of an asymmetric differential line pair.
Figure 19B:
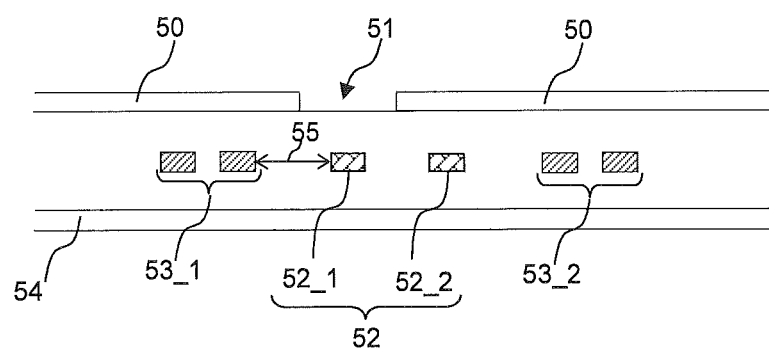

FIGS. 19A and 19B are diagrams illustrating the electromagnetic wave absorber disposed in the vicinity of an asymmetric differential line pair. FIG. 19A shows a schematic top view of the asymmetric portion of the differential line pair in the circuit board 1 viewed from the first main surface 1a side, and FIG. 19B shows a schematic cross-sectional view of the circuit board 1 corresponding to cross-section A-A' of FIG. 19A. In FIGS. 19A and 19B, only some of the interconnect layers of the interconnect layers LW1 to LWn are illustrated for convenience of illustration and description.

In FIGS. 19A and 19B, a region (hole) 51 is present which has no metal pattern in the upper portion of a signal interconnect 52_1 of a differential signal line pair 52 forming a strip line structure in which the upper and lower portions are interposed by a metal solid pattern 50 and a metal solid pattern 54. The differential signal line pair 52 becomes asymmetric due to the hole 51.

As mentioned above, traveling electromagnetic waves propagating through the signal path constituting a differential pair are generated by the synthesis of an electromagnetic field in a bonding mode and an electromagnetic field in an anti-bonding mode. The bonding mode is a mode in which an electromagnetic field is localized in a void between (inside) two signal lines constituting a differential pair, and a voltage generated in the two signal lines becomes anti-phase (differential mode). On the other hand, the anti-bonding mode is a mode in which an electromagnetic field spreads (that is, electromagnetic radiation is generated) in a void around (outside) two signal lines constituting a differential pair, and a voltage generated in the two signal lines becomes in-phase (common mode). Only the bonding mode is excited in ideal differential signal transmission. Supposing an asymmetric portion is present in the differential signal line, an electromagnetic field in an anti-bonding mode is excited in case that signal electromagnetic waves reach the asymmetric portion. For example, in FIGS. 19A and 19B, incase that the signal electromagnetic waves propagating through the differential signal line pair 52 reach the portion of the hole 51, an electromagnetic field in an anti-bonding mode is excited, and thus an in-phase signal component (common mode noise) is generated which is not changed to zero even in case that bilateral signals of the differential signal line pair 52 are overlapped with each other. The excitation of an electromagnetic field in an anti-bonding mode is observed as the impedance asymmetry or skew of the differential pair in an electric circuit manner. From this, the present inventor has found that in case that an electromagnetic field in an anti-bonding mode can be removed, common mode noise is not generated due to the presence of the structural asymmetric portion in the differential transmission path, and skew or impedance asymmetry can be extinguished.

For example, as shown in FIGS. 19A and 19B, metal pieces 53_1 and 53_2 are disposed at positions spaced by a predetermined distance from the asymmetric portion (hole 51) in the differential signal line pair 52. Specifically, the metal pieces 53_1 and 53_2 are disposed so as to interpose the asymmetric portion in the signal interconnect 52_1 and the signal interconnect 52_2. This is because insofar as possible, a position is selected at which an electromagnetic field in an anti-bonding mode is absorbed and an electromagnetic field in a bonding mode is not absorbed. As mentioned above, since the distributions of an electromagnetic fields are different from each other in a bonding mode and a non-bonding mode, the metal pieces 53_1 and 53_2 are disposed outside the signal interconnect 52_1 and the signal interconnect 52_2, and thus it is possible to appropriately remove an electromagnetic field in a non-bonding mode, and to suppress the generation of common mode noise.

Figure 20A:
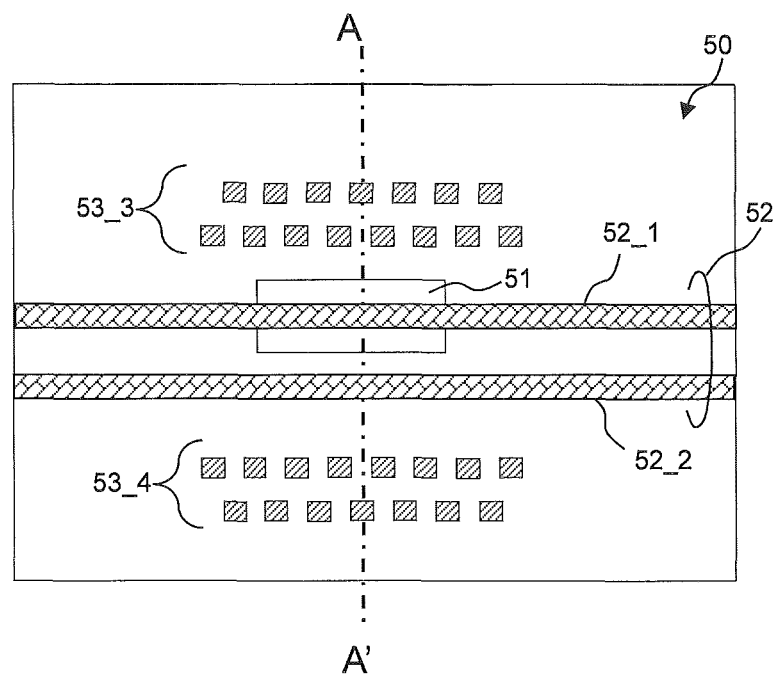
FIGS. 20A and 20B are diagrams illustrating another electromagnetic wave absorber disposed in the vicinity of the asymmetric differential line pair.
Figure 20B:
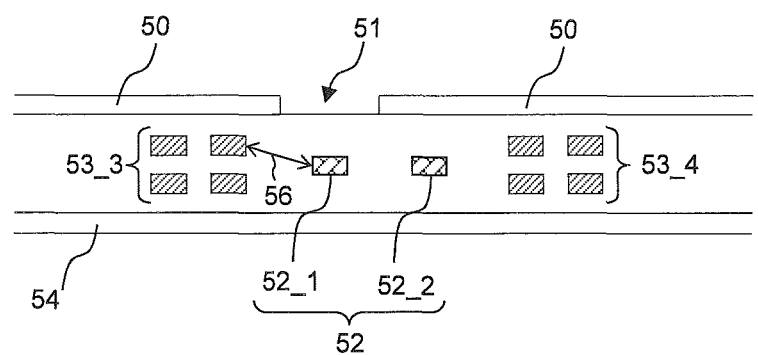

FIGS. 20A and 20B are diagrams illustrating another electromagnetic wave absorber disposed in the vicinity of the asymmetric differential line pair. FIG. 20A shows a schematic top view of the asymmetric portion of the differential signal line pair in the circuit board 1 viewed from the first main surface 1a side, and FIG. 20B shows a schematic cross-sectional view of the circuit board 1 corresponding to cross-section A-A' of FIG. 20A. FIGS. 19A and 19B mentioned above illustrate a case where a plurality of metal pieces 53_1 and 53_2 used as the electromagnetic wave absorber are formed in the same interconnect layer as the differential signal line pair 52, but FIGS. 20A and 20B illustrate a case where a plurality of metal pieces 53_3 and 53_4 are disposed in a vertical direction. According to this, as is the case with FIGS. 19A and 19B, it is possible to appropriately remove an electromagnetic field in a non-bonding mode, and to suppress the generation of common mode noise. Meanwhile, in the metal pieces 53_1 and 53_2 of FIGS. 19A and 19B and the metal pieces 53_3 and 53_4 of FIGS. 20A and 20B, horizontal distances up to the differential signal line pair 52 are different from each other, but linear distances 55 and 56 up to the differential signal line pair 52 are equal to each other. This is taking into consideration that electromagnetic waves are propagated radially centering on the differential signal line pair 52.

Figure 21A:
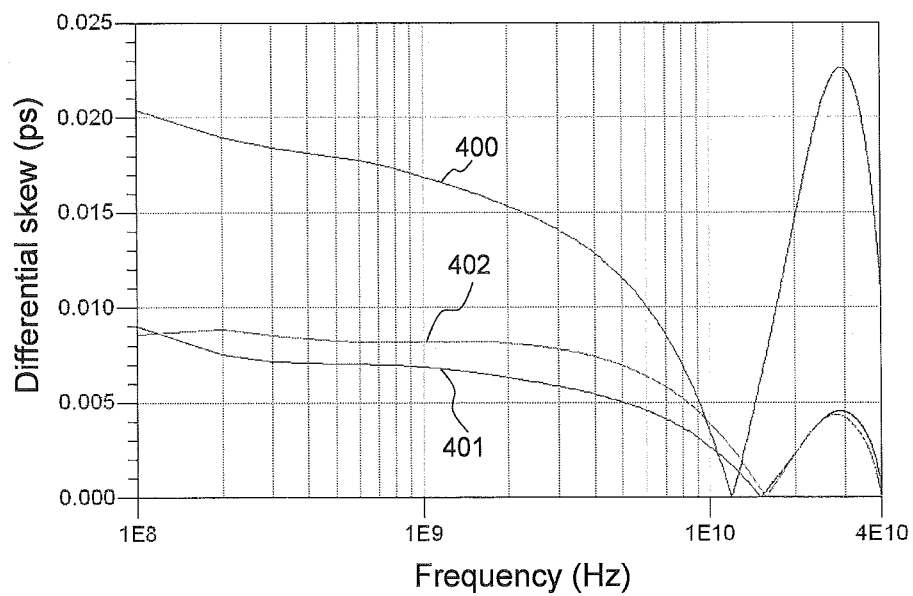
FIGS. 21A and 21B are characteristic diagrams illustrating the transmission characteristics of a differential transmission path in case that the electromagnetic wave absorber is disposed in an asymmetric portion of a differential signal line pair.
Figure 21B:
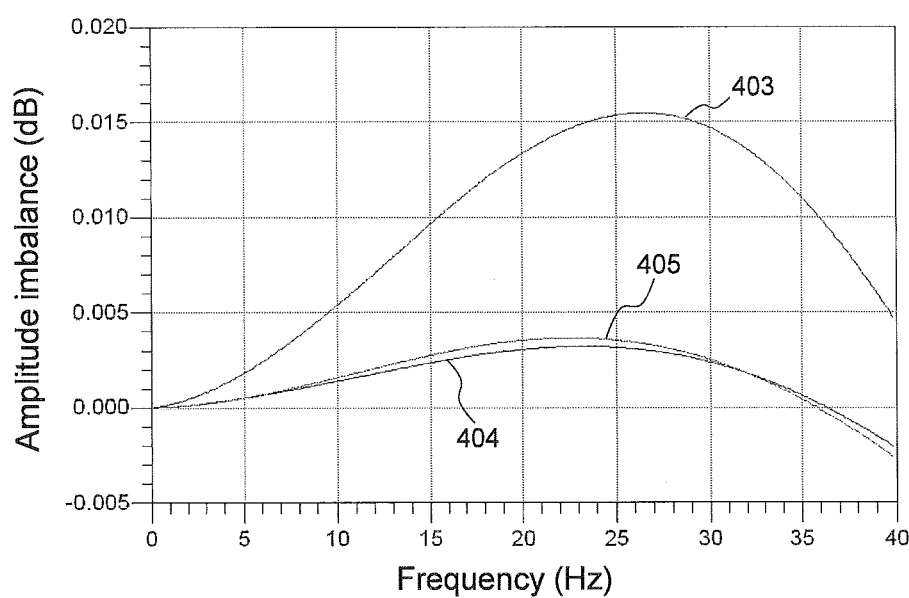

FIGS. 21A and 21B are characteristic diagrams illustrating the transmission characteristics of the differential transmission path in case that the electromagnetic wave absorber is disposed in the asymmetric portion of the differential signal line pair. As the transmission characteristics of the differential transmission path, FIG. 21A shows the characteristics of skew (differential skew) with respect to a signal frequency, and FIG. 21B shows the characteristics of signal amplitude imbalance between differential signals with respect to a signal frequency.

In FIGS. 21A and 21B, reference numeral 400 denotes the characteristics of skew in case that metal pieces 53_1 to 53_4 are not disposed in the configuration of FIGS. 19A and 19B, reference numeral 401 denotes the characteristics of skew in case that the metal pieces 53_1 and 53_2 are disposed as in FIGS. 19A and 19B, and reference numeral 402 denotes the characteristics of skew in case that the metal pieces 53_3 and 53_4 are disposed as in FIGS. 20A and 20B. In addition, reference numeral 403 denotes the characteristics of signal amplitude imbalance in case that the metal pieces 53_1 to 53_4 are not disposed in the configuration of FIGS. 19A and 19B, reference numeral 404 denotes the characteristics of signal amplitude imbalance in case that the metal pieces 531 and 532 are disposed as shown in FIGS. 19A and 19B, and reference numeral 405 denotes the characteristics of signal amplitude imbalance in case that the metal pieces 53_3 and 53_4 are disposed as shown in FIGS. 20A and 20B.

As shown by reference numerals 401 and 402, it is understood that the skew is drastically improved by disposing the metal pieces 53_1 to 53_4 so as to interpose the asymmetric portion of the differential signal line pair. In addition, as shown by reference numerals 404 and 405, it is understood that the signal amplitude imbalance is drastically improved by disposing the metal pieces 53_1 to 53_4 so as to interpose the asymmetric portion of the differential signal line pair.

As mentioned above, the electromagnetic wave absorber is disposed in the vicinity of the asymmetric portion in the differential signal line pair, and thus it is possible to remove an electromagnetic field in an anti-bonding mode, and to suppress the skew or impedance asymmetry generation in the differential signal path.

Fourth Embodiment

Figure 22:
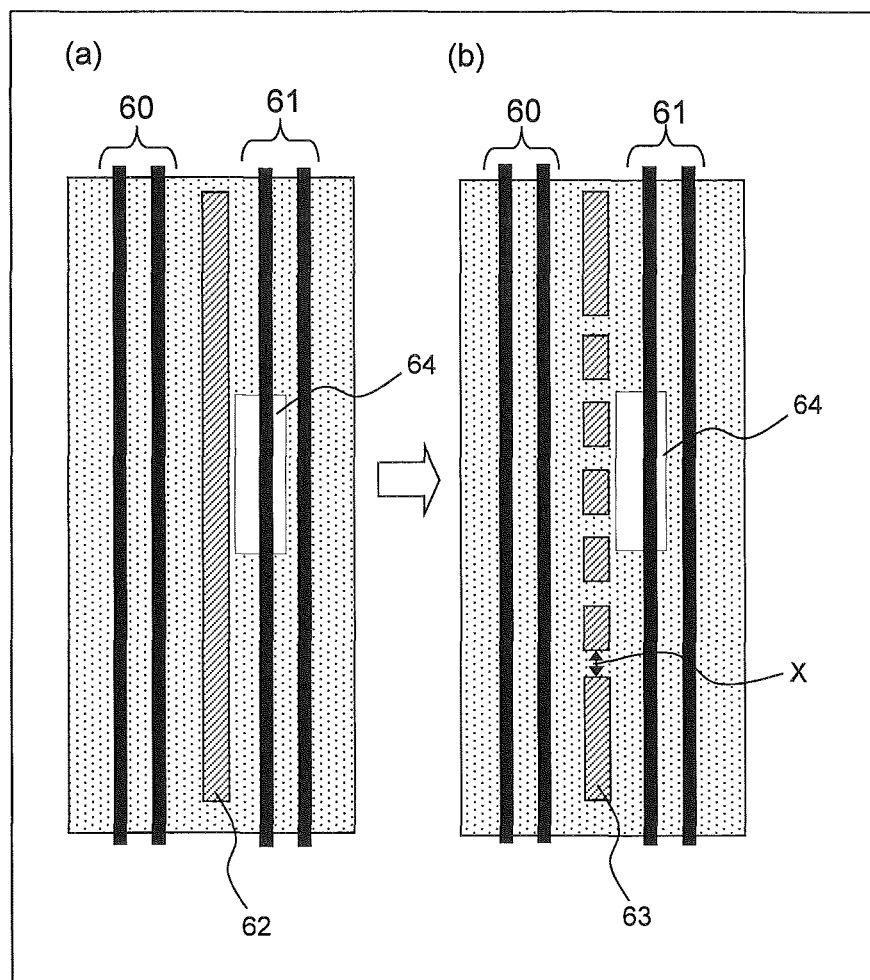
FIG. 22 is a diagram illustrating another electromagnetic wave absorber disposed in the vicinity of the asymmetric differential line pair.

FIG. 22 is a diagram illustrating another electromagnetic wave absorber disposed in the vicinity of the asymmetric differential line pair. FIG. 22 show schematic top views of the asymmetric portion of the differential line pair in the circuit board 1 viewed from the first main surface 1a side. As shown in a part (a) of FIG. 22, a region (hole) 64 having no metal pattern in the upper portion of one signal line of a differential signal line pair 61 is present as in FIGS. 19A and 19B and FIGS. 20A and 20B. The differential signal line pair 61 becomes asymmetric due to the hole 64.

Another differential signal line pair 60 different from the differential signal line pair 61 is formed in an interconnect layer in which the differential signal line pair 61 is formed. In the interconnect layer, a shield interconnect 62 is further formed between the differential signal line pair 61 and the differential signal line pair 60.

Generally, the greatest merit of the differential signal path is in that since paired signals are antiphase to each other, both incoming noise and outgoing noise are offset, that is, crosstalk is offset. However, in case that the asymmetric portion is present in the differential signal line pair, an electromagnetic field in an anti-bonding mode is generated as mentioned above, and thus crosstalk increases drastically. For example, as shown in a part (a) of FIG. 22, in case that a plurality of differential signal line pairs 60 and 61 are arranged in parallel, the presence of the asymmetric portion in one signal line of the differential signal line pair 61 generates large crosstalk between the signal line and another differential signal line pair 60 disposed in the vicinity thereof. The distance between the differential signal line pair 60 and the differential signal line pair 61 may be preferably increased in order to reduce the crosstalk, but in that case, signal density is reduced, and thus the entire signal transmission band is restricted. Consequently, as shown in a part (b) of FIG. 22, a portion of a region of a shield line 63 provided between the differential signal line pairs 60 and 61 is formed in a perforation shape. Specifically, in a portion of the region between the asymmetric portion of the differential signal line pair 61 and the differential signal line pair 60, the shield line 63 is formed at a predetermined distance X. The distance X is preferably set to be the above distance equal to or less than $\lambda/20$. According to this, the symmetry of the differential signal line pair 61 is improved, and thus it is possible to drastically reduce the crosstalk.

Figure 23:
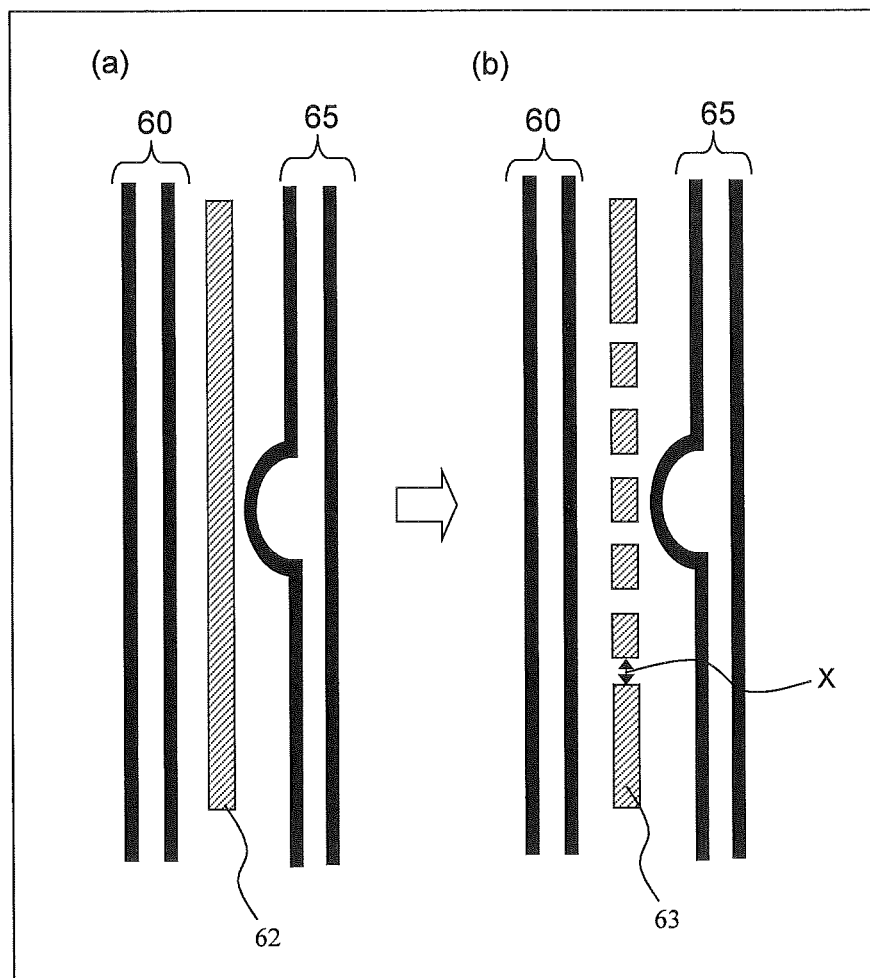
FIG. 23 is a diagram illustrating still another electromagnetic wave absorber disposed in the vicinity of the asymmetric differential line pair.

FIG. 23 is a diagram illustrating still another electromagnetic wave absorber disposed in the vicinity of the asymmetric differential line pair. FIG. 23 show schematic top views illustrating the asymmetric portion of the differential line pair in the circuit board 1 viewed from the first main surface 1a side. As shown in a part (a) of FIG. 23, a portion of one signal line of a differential signal line pair 65 is curved, and a portion having a different length of the signal line is present. The differential signal line pair 65 becomes asymmetric due to the portion. Even in such a case, as shown in a part (b) of FIG. 23, a portion of the region of the shield line 63 provided between the differential signal line pairs 60 and 65 is formed in a perforation shape. Therefore, as is the case with FIG. 22, it is possible to drastically reduce the crosstalk between the differential signal line 60 and the differential signal line pair 65.

Fifth Embodiment

Figure 24A:
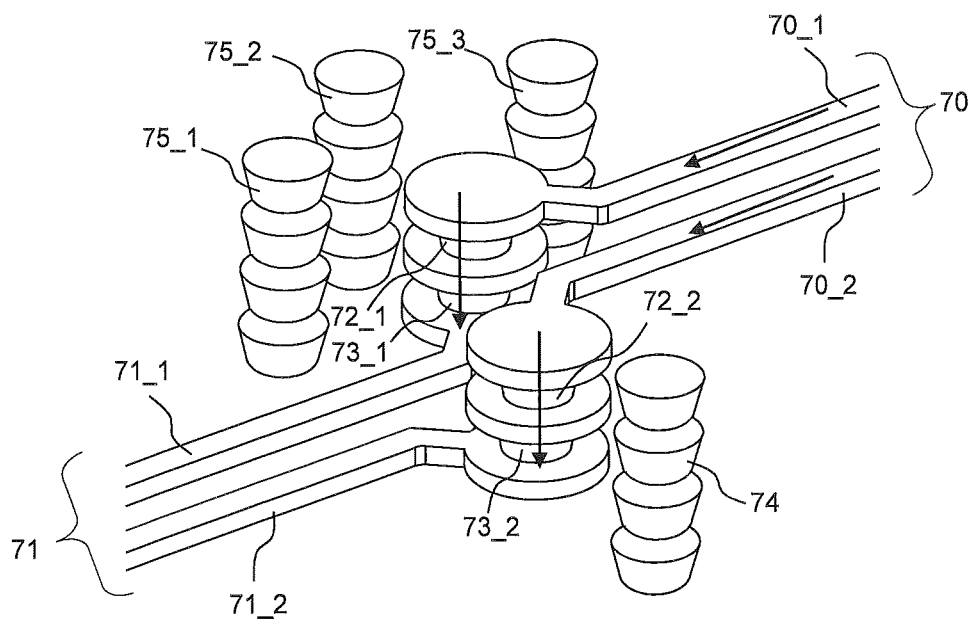
FIGS. 24A and 24B are diagrams illustrating an interconnect portion of a differential signal path.
Figure 24B:
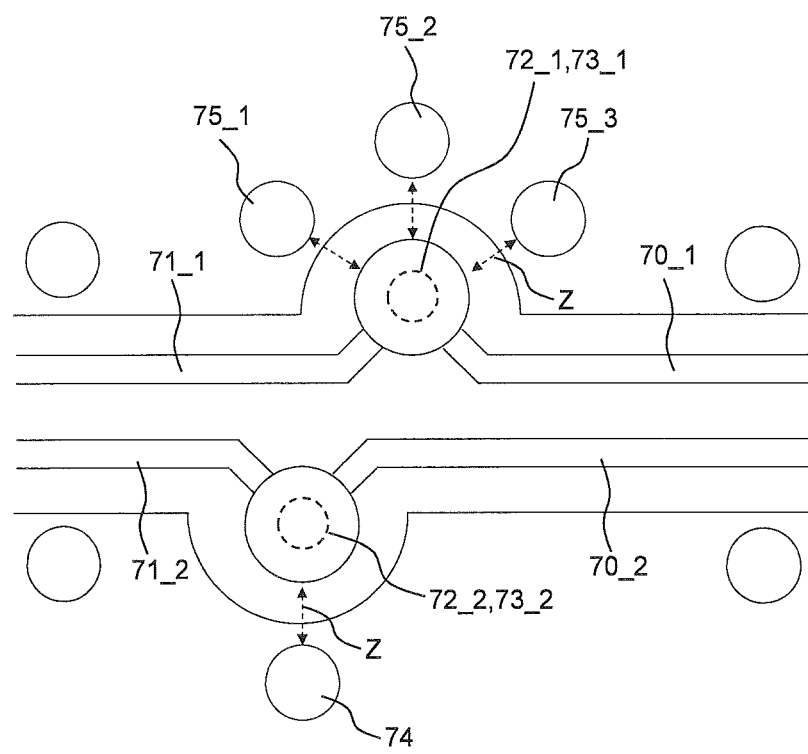

FIGS. 24A and 24B are diagrams illustrating an interconnect portion of a differential signal path. FIG. 24A shows a schematic perspective view of a portion in which the differential signal path in the circuit board 1 is formed, and FIG. 24B shows a schematic top view of the portion in which the differential signal path formed, viewed from the first main surface 1a side.

The differential signal path shown in FIGS. 24A and 24B has, for example, a structure in which a differential signal which is output from the semiconductor chip 2 is supplied to differential signal line pairs 70_1 and 70_2 formed in the upper layer (for example, interconnect layer L0) of the circuit board 1, and is propagated to a differential signal pair (71_1 or 71_2) formed in the lower layer (for example, interconnect layer L2) of the circuit board 1 through non-through vias 72_1, 72_2, 73_1, and 73_2 for a signal. In the above-mentioned differential signal path, in order to propagate a differential signal in a vertical direction through the non-through vias 72_1, 72_2, 73_1, and 73_2 for a signal, ground vias 74, and 75_1 to 75_3 connected to a ground node (ground interconnect) are disposed at positions spaced at a predetermined distance Z from the non-through vias 72_1, 72_2, 73_1, and 73_2 for a signal when seen in a plan view. Thereby, an electric field is formed in a signal traveling direction, and thus the differential signal can be propagated from the upper-layer differential signal line pairs 70_1 and 70_2 toward the lower-layer differential signal line pairs 71_1 and 71_2. Meanwhile, the non-through vias 72_1 and 72_2 for a signal are collectively denoted by a non-through via 72 for a signal, the non-through vias 73_1 and 73_2 for a signal are collectively denoted by a non-through via 73 for a signal, the differential signal line pairs 70_1 and 70_2 are collectively denoted by a differential signal line pair 70, the differential signal line pairs 71_1 and 71_2 are collectively denoted by a differential signal line pair 71, and the ground vias 751 to 75_3 are collectively denoted by a ground via 75.

As shown in FIGS. 24A and 24B, in case that the numbers of ground vias 74 and 75 are different from each other in the non-through vias 72_1 and 73_1 side for a signal and the non-through vias 72_2 and 72_2 side for a signal, the portion becomes an asymmetric portion in the differential signal path, and the skew or signal amplitude imbalance occurs in the differential signal path as mentioned above. Consequently, as shown in FIGS. 25 and 26 below, the electromagnetic wave absorber is disposed.

FIG. 25 is a diagram illustrating the electromagnetic wave absorber disposed in the vicinity of the interconnect portion of the differential signal path. FIG. 25 illustrates a configuration in which a plurality of vias 76 and 77 used as the electromagnetic wave absorber are disposed in the vicinity of the asymmetric portion of the differential signal path. The vias 76 are linearly disposed in the signal lines 70_1 and 71_1 side along the signal lines 70_1 and 71_1, and the vias 77 are linearly disposed in the signal lines 70_2 and 71_2 side along the signal lines 70_2 and 71_2. That is, the vias 76 and 77 are disposed so as to interpose the non-through vies 72 and 73 for a signal. As is the case with the above, the distance X between each of the vias 76_1 to 76_5 is equal to or less than $\lambda/20$. The distance between each of the vias 77_1 to 77_5 is the same. Although not shown, the vias 76 and 77 are constituted by a plurality of non-through vias which are laminated in a vertical direction. The number of non-through vias which are vertically laminated is not particularly limited, but is equal to, for example, the number of non-through vias constituting the ground vias 74 and 75.

Figure 26:
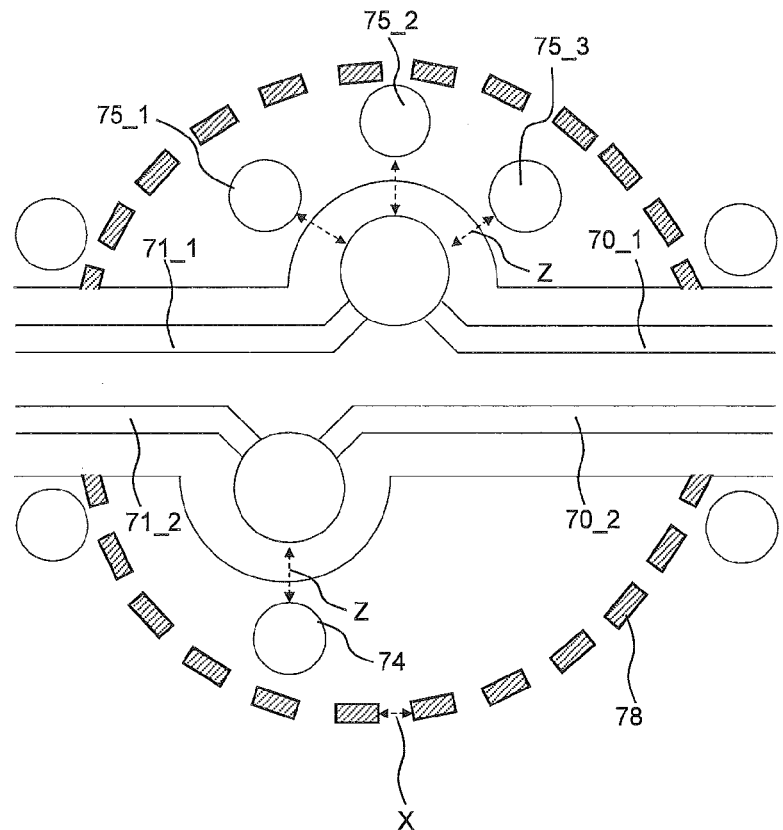
FIG. 26 is a diagram illustrating another electromagnetic wave absorber disposed in the vicinity of the interconnect portion of the differential signal path.

FIG. 26 is a diagram illustrating another electromagnetic wave absorber disposed in the vicinity of the interconnect portion of the differential signal path. FIG. 26 illustrates a configuration in which a plurality of metal pieces 78 used as the electromagnetic wave absorber are disposed in the vicinity of the asymmetric portion of the differential signal path. As shown in FIG. 26, the plurality of metal pieces 78 are disposed in a ring shape so as to surround the asymmetric portion of the differential signal path (non-through vias 72 and 73 for a signal, and ground vias 74 and 75). As is the case with the above, the distance X between the plurality of metal pieces 78 is equal to or less than λ/20. Although not shown, the plurality of metal pieces 78 are formed in a plurality of interconnect layers. The number of interconnect layers for forming the metal piece 78 is not particularly limited, but, for example, the number corresponding to the number of non-through vias constituting the ground vias 74 and 75 may be formed.

Figure 27A:
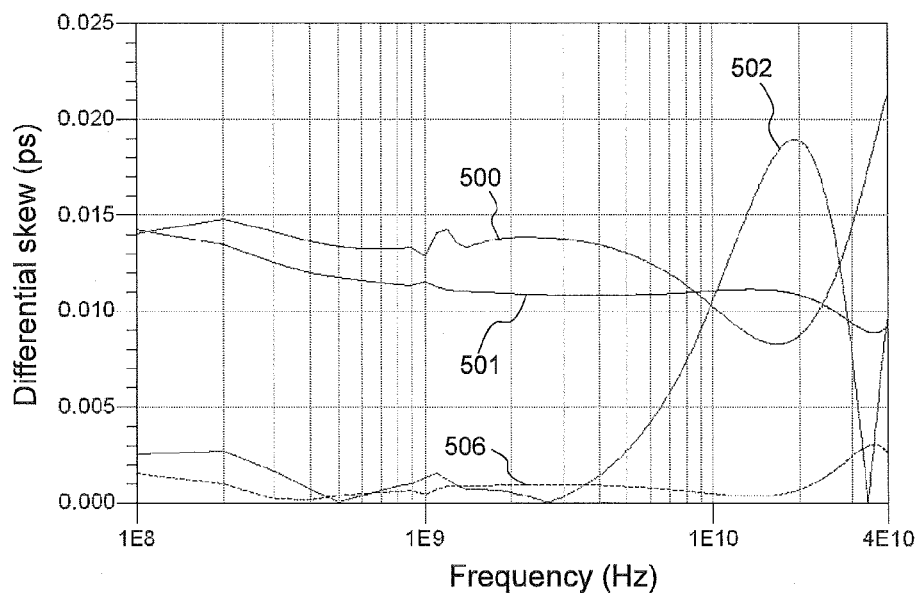
FIGS. 27A and 27B are characteristic diagrams illustrating the transmission characteristics of the differential transmission path in a structure of FIG. 25 and FIG. 26.
Figure 27B:
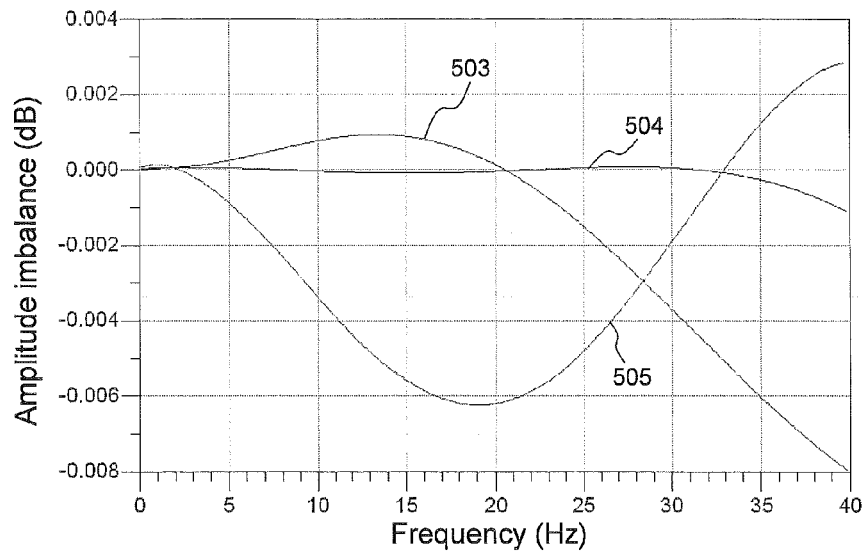

FIGS. 27A and 27B illustrate the transmission characteristics of the differential transmission path having a structure of FIGS. 25 and 26. As the transmission characteristics of the differential transmission path, FIG. 27A illustrates the characteristics of skew (differential skew) with respect to a signal frequency, and FIG. 27B illustrates the characteristics of signal amplitude imbalance between differential signals with respect to a signal frequency.

In FIGS. 27A and 27B, reference numeral 500 denotes the characteristics of skew in a case of the structure of FIGS. 24A and 24B (case where the electromagnetic wave absorber is not disposed), reference numeral 501 denotes the characteristics of skew in a case of the structure of FIG. 25 (case where the vias 76 and 77 are disposed), and reference numeral 502 denotes the characteristics of skew in a case of the structure of FIG. 26 (case where the plurality of metal pieces 78 are disposed). In addition, reference numeral 503 denotes the characteristics of signal amplitude imbalance in a case of the structure of FIGS. 24A and 24B (case where the electromagnetic wave absorber is not disposed), reference numeral 504 denotes the characteristics of signal amplitude imbalance in a case of the structure of FIG. 25 (case where the vias 76 and 77 are disposed), and reference numeral 505 denotes the characteristics of signal amplitude imbalance in a case of the structure of FIG. 26 (case where the plurality of metal pieces 78 are disposed).

In case that the vias 76 and 77 are disposed, the skew is not greatly improved as shown by reference numeral 501, but the signal amplitude imbalance is drastically improved as shown by reference numeral 504. In this case, when there is a slight difference between the signal line lengths of two differential signal lines, the skew can be improved as shown by reference numeral 506.

On the other hand, in case that the plurality of metal pieces 78 are disposed in a ring shape, the signal amplitude imbalance is not greatly improved as shown by reference numeral 505, but the skew is drastically improved at a frequency of less than 5 GHz as shown by reference numeral 502. The reason why the signal amplitude imbalance is not improved at a range of 5 GHz or more is that the ground plane which is present between the non-through vias 72 and 73 for a signal and the metal piece 78 shields an electromagnetic field. In other words, this is because in case that the frequency is relatively low, the electromagnetic waves are diffracted and can wrap around up to the metal piece 78, but in case that the frequency is high, the electromagnetic waves cannot be diffracted and cannot reach the metal piece 78. Therefore, in case that the plurality of metal pieces 78 are disposed closer to the non-through vias 72 and 73 for a signal used as the electromagnetic wave absorber, the skew can be improved even at a higher frequency.

As mentioned above, the skew and signal amplitude balance in the differential signal path can be independently controlled through the structure and arrangement of the electromagnetic wave absorber. Naturally, the configuration in which the vias 76 and 77 are disposed as shown in FIG. 25 and the configuration in which the plurality of metal pieces 78 are disposed as shown in FIG. 26 are combined, thereby allowing both the skew and the signal amplitude imbalance to be improved.

Sixth Embodiment

Figure 28:
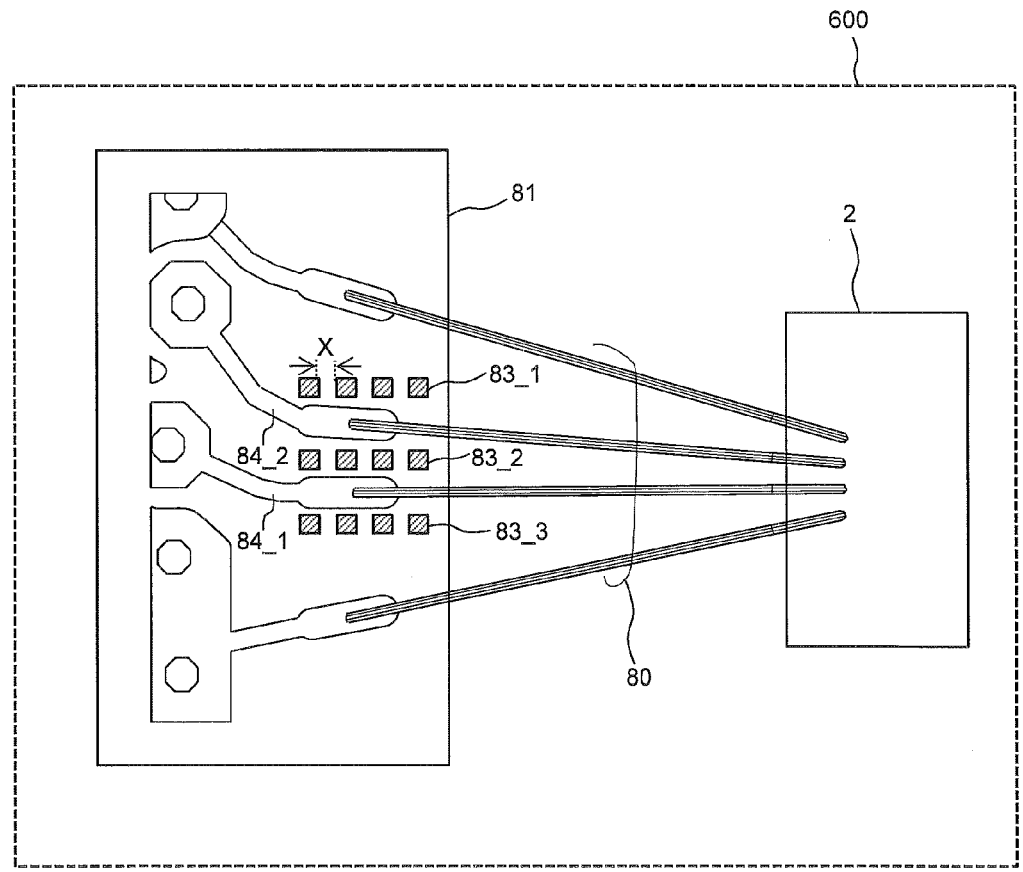
FIG. 28 is a diagram illustrating a semiconductor device having a configuration in which a semiconductor chip and a circuit board are connected to each other through a bonding wire.

FIG. 28 is a diagram illustrating a semiconductor device having a configuration in which a semiconductor chip and a circuit board are connected to each other through a bonding wire. In FIG. 28, a portion in which a circuit board 81 and a semiconductor chip 2 in a semiconductor device 600 are connected to each other through a bonding wire 80 is enlarged and illustrated. In FIG. 28, a high-frequency signal is supplied to interconnect patterns 84_1 and 84_2. As shown in FIG. 28, a plurality of metal pieces 83_1 to 83_3 used as the above-mentioned electromagnetic wave absorber are disposed in the vicinity of the interconnect patterns 84_1 and 84_2 to which the bonding wire 80 in the circuit board 81 is connected. The distance X between each of the metal pieces is preferably equal to or less than λ20 as mentioned above.

According to this, as is the case with the above, it is possible to eliminate impedance discontinuity generated in the connection portion between the circuit board 81 and the bonding wire 80.

As stated above, while the invention devised by the present inventor has been described in detail based on the embodiments, the present invention is not limited thereto. It goes without saying that various modifications and changes can be made without departing from the scope of the invention.

For example, in the first to sixth embodiments, a case where one semiconductor chip is mounted onto the circuit board 1 is illustrated, but is not limited thereto. For example, in a semiconductor device in which a plurality of semiconductor chips are mounted on the circuit board 1 as in a SIP (System In Package), in case that an impedance discontinuity portion or an asymmetric portion of a differential pair is present in an interconnect between chips, an electromagnetic wave absorber may also be provided in the vicinity thereof. Thereby, the same operations and effects as mentioned above are exhibited.

In the first to sixth embodiments, a case where the electromagnetic wave absorber is formed in the interconnect layer of the interposer (circuit board 1) is illustrated, but it is also possible to form the electromagnetic wave absorber in the interconnect layer within the mounting substrate 13. Thereby, as is the case with the above, it is possible to eliminate impedance discontinuity and differential pair asymmetry in the mounting substrate 13.

In FIGS. 5A and 5B and FIGS. 7A and 7B, the metal piece 21 and the metal pattern 26 are formed in the interconnect layer L2 by way of example, but may be formed in another interconnect layer, without being limited thereto. For example, the metal piece and the metal pattern may be formed in the interconnect layer L3 instead of the inductor pattern 23. The same is true of FIGS. 17A to 17C and FIGS. 18A to 18C.

The electromagnetic wave absorber is formed by the same metal member as the interconnect pattern in the circuit board 1 by way of example, but the electromagnetic wave absorber may be formed by a metal member separate from the interconnect pattern insofar as the member is a paramagnetic metal member.

In FIGS. 19A and 19B and FIGS. 20A and 20B, a plurality of metal pieces 53_1 to 53_4 are disposed in the vicinity of the region (hole) 51 having no metal pattern in the upper portion of one signal interconnect by way of example, but the same effect is obtained in the vicinity of the asymmetric portion in the differential signal line pair 52. For example, as shown in FIGS. 23A and 23B, the plurality of metal pieces 53_1 to 53_4 are disposed in the vicinity of the portion having a different shape of bilateral interconnects, and thus it is possible to suppress the generation of common mode noise.

What is claimed is:

1. A semiconductor device, comprising:
   a semiconductor chip;
   a plurality of external terminals; and
   a board for electrically connecting the semiconductor chip and the external terminal,
   wherein the board includes
   a first main surface in which a plurality of first electrodes electrically connected to the semiconductor chip are formed,
   a second main surface, facing the first main surface, in which a plurality of second electrodes electrically connected to the plurality of external terminals are formed, and
   a plurality of interconnect layers, provided between the first main surface and the second main surface, for forming a plurality of signal paths that electrically connect the first electrode and the second electrode corresponding thereto, and
   the interconnect layers include a plurality of metal members which are dispersedly disposed in equidistance at a distance shorter than an electromagnetic wavelength equivalent to a signal band of a signal supplied to the signal paths, in a vicinity of a portion in which an interconnect for forming the signal paths has a different structure than an adjacent interconnect.

2. The semiconductor device according to claim 1, wherein the plurality of metal members are dispersedly formed at a distance equal to or less than one twentieth of an electromagnetic wavelength equivalent to a signal band of a signal supplied to the signal paths.

3. The semiconductor device according to claim 1, wherein the plurality of metal members are formed in at least one interconnect layer of the plurality of interconnect layers so as to overlap the second electrode when seen in a plan view.

4. The semiconductor device according to claim 3, wherein a signal line having inductive impedance is formed in an interconnect layer different from an interconnect layer in which the plurality of metal members are formed, and
   wherein the second electrode is connected to the first electrode through the signal line having inductive impedance.

5. The semiconductor device according to claim 1, wherein the board further includes:
   a through via which is formed passing through a plurality of interconnect layers and
   a first non-through via and a second non-through via for connecting interconnect layers adjacent to each other,
   wherein the plurality of interconnect layers include:
      a first interconnect layer in which a first signal line is formed,
      a second interconnect layer, provided at an upper side of the first interconnect layer when seen in a cross-sectional view, in which a first interconnect land is formed,
      a third interconnect layer, provided at an upper side of the second interconnect layer when seen in a cross-sectional view, in which a second interconnect land is formed, and
      a fourth interconnect layer, provided at an upper side of the third interconnect layer when seen in a cross-sectional view, in which a second interconnect is formed,
   wherein the first interconnect land and the second interconnect land are connected to each other through the through via,
   wherein the first interconnect land and the first interconnect are connected to each other through the first non-through via,
   wherein the second interconnect land and the second interconnect are connected to each other through the second non-through via, and
   wherein the plurality of metal members are formed in the fourth interconnect layer so as to overlap the through via when seen in a plan view.

6. The semiconductor device according to claim 5, wherein the plurality of metal members are formed in the first interconnect layer so as to overlap the through via when seen in a plan view.

7. The semiconductor device according to claim 1, wherein the plurality of signal paths include two signal paths constituting a differential pair, and
   wherein the plurality of metal members are formed in a vicinity of an asymmetric portion in the two signal paths.

8. The semiconductor device according to claim 7, wherein the plurality of interconnect layers include an interconnect layer in which a third signal line and a fourth signal line for constituting a differential pair with the third signal line are formed, and
   wherein in the interconnect layer in which the third signal line and the fourth signal line are formed, the plurality of metal members are disposed so as to interpose a portion in which the third signal line and the fourth signal line are asymmetric.

9. The semiconductor device according to claim 8, wherein the portion in which the third signal line and the fourth signal line are asymmetric includes a portion in which a shape of an interconnect pattern of the third signal line and a shape of an interconnect pattern of the fourth signal line are different from each other.

10. The semiconductor device according to claim 8, wherein the portion in which the third signal line and the fourth signal line are asymmetric includes a portion in which a structure of an interconnect layer located at an upper or lower side of the third signal line and a structure of an interconnect layer located at an upper or lower side of the fourth signal line are different from each other.

11. The semiconductor device according to claim 7, wherein the plurality of interconnect layers include an interconnect layer in which a first differential signal line pair constituted by two signal lines, a second differential signal line pair constituted by two signal lines which is different from the first differential signal line pair, and a shielding pattern disposed in parallel between the first differential signal line pair and the second differential signal line pair are formed, and
   wherein in the shielding pattern, a portion of an interconnect pattern between an asymmetric portion in the first differential signal line pair and the second differential signal line pair is formed in a perforation shape.

12. The semiconductor device according to claim 1, wherein the board further includes:
- a first signal via and a second signal via for electrically connecting a signal line formed in a different interconnect layer, and
- a first ground via and a second ground via, connected to a ground interconnect formed in a different interconnect layer, which are provided corresponding to the first signal via and the second signal via,
wherein the plurality of interconnect layers include:
- a fifth interconnect layer in which a third signal line and a fourth signal line for constituting a differential pair with the third signal line are formed, and
- a sixth interconnect layer in which a fifth signal line and a sixth signal line for constituting a differential pair with the fifth signal line are formed,
wherein the third signal line and the fifth signal line are electrically connected to each other through the first signal via,
wherein the fourth signal line and the sixth signal line are electrically connected to each other through the second signal via,
wherein the first ground via is disposed at a predetermined distance from the first via,
wherein the second ground via is disposed at a predetermined distance from the second via,
wherein the number of first ground vias and the number of second ground vias are different from each other, and
wherein the plurality of metal members are disposed in the vicinity of a region including the first signal via, the second signal via, the first ground via, and the second ground via.

13. The semiconductor device according to claim 12, wherein the plurality of metal members are disposed outside the region in a ring shape when seen in a plan view.

14. The semiconductor device according to claim 12, wherein the plurality of metal members are linearly disposed outside the region when seen in a plan view, and
wherein the metal member is configured to include a via for connecting different interconnect layers.

15. The semiconductor device according to claim 1, wherein the metal member is formed in a circular shape when seen in a plan view.

16. A semiconductor device, comprising:
a semiconductor chip;
a plurality of external terminals; and
a board for electrically connecting the semiconductor chip and the external terminal,
wherein the board includes:
- a first main surface in which a plurality of first electrodes electrically connected to the semiconductor chip are formed,
- a second main surface, facing the first main surface, in which a plurality of second electrodes electrically connected to the plurality of external terminals are formed, and
- a plurality of interconnect layers, provided between the first main surface and the second main surface, for forming a plurality of signal paths that electrically connect the first electrode and the second electrode corresponding thereto, and
wherein the interconnect layers include a metal pattern in which a plurality of through holes are dispersedly formed in equidistance, in a vicinity of a portion in which an interconnect for forming the signal paths has a different structure than an adjacent interconnect.

17. The semiconductor device according to claim 16, wherein the plurality of through holes in the metal pattern are formed so that a diameter thereof is equal to or less than one twentieth of an electromagnetic wavelength equivalent to a signal band of a signal supplied to the signal paths.

18. The semiconductor device according to claim 16, wherein the metal pattern is formed in at least one interconnect layer of the plurality of interconnect layers so as to overlap the second electrode when seen in a plan view.

19. The semiconductor device according to claim 18, wherein a signal line having inductive impedance is formed in an interconnect layer different from an interconnect layer in which the metal pattern is formed, and
wherein the second electrode is connected to the first electrode through the signal line having inductive impedance.

20. A circuit board, comprising:
a first main surface in which a plurality of first electrodes are formed;
a second main surface, facing the first main surface, in which a plurality of second electrodes are formed; and
a plurality of interconnect layers, provided between the first main surface and the second main surface, for forming a plurality of signal paths that electrically connect the first electrode and the second electrode corresponding thereto,
wherein the interconnect layers include a metal pattern in which a plurality of through holes are dispersedly formed in equidistance, in a vicinity of a portion in which an interconnect for forming the signal paths has a different structure than an adjacent interconnect.

* * * * *